(12) United States Patent
Yamaga

(10) Patent No.: US 8,499,216 B2
(45) Date of Patent: Jul. 30, 2013

(54) SEMICONDUCTOR STORAGE DEVICE, METHOD OF CONTROLLING THE SAME, AND ERROR CORRECTION SYSTEM

(71) Applicant: Kabushiki Kaisha Toshiba, Tokyo (JP)

(72) Inventor: Akira Yamaga, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/743,727

(22) Filed: Jan. 17, 2013

(65) Prior Publication Data

US 2013/0132795 A1    May 23, 2013

Related U.S. Application Data

(63) Continuation of application No. 13/334,438, filed on Dec. 22, 2011, now Pat. No. 8,381,066, which is a continuation of application No. 12/867,068, filed as application No. PCT/JP2008/067585 on Sep. 19, 2008, now Pat. No. 8,086,933.

(30) Foreign Application Priority Data

Feb. 29, 2008    (JP) .................................. 2008-051419

(51) Int. Cl.
 *H03M 13/00*    (2006.01)
(52) U.S. Cl.
 USPC .......................................................... 714/755
(58) Field of Classification Search
 USPC ........................... 714/746, 752, 755, 782, 784
 See application file for complete search history.

(56) References Cited

U.S. PATENT DOCUMENTS

| 4,768,193 A | 8/1988 | Takemai |
| 5,357,527 A | 10/1994 | Coates et al. |
| 5,432,800 A | 7/1995 | Kuroda et al. |
| 5,517,484 A | 5/1996 | Takagi et al. |
| 6,052,815 A | 4/2000 | Zook |
| 6,101,625 A * | 8/2000 | Higashi .......................... 714/776 |
| 6,907,561 B2 * | 6/2005 | Kojima .......................... 714/784 |
| 2004/0187052 A1 | 9/2004 | Shiota et al. |

(Continued)

FOREIGN PATENT DOCUMENTS

| GB | 2 426 085 A | 11/2006 |
| JP | 63 275225 | 11/1988 |
| JP | 2004 280556 | 10/2004 |
| JP | 2007 87464 | 4/2007 |

OTHER PUBLICATIONS

Micheloni et al., Error Correction Coded for Non-Volatile Memories, 2008, Springer, pp. 1 to 338.

Extended European Search Report issued Feb. 28, 2012, in Patent Application No. 08872770.6.

(Continued)

*Primary Examiner* — Shelly A Chase

(74) *Attorney, Agent, or Firm* — Oblon, Spivak, McClelland, Maier & Neustadt, L.L.P.

(57) ABSTRACT

A semiconductor storage device, a method of controlling the same, and an error correction system allow reduction in power consumption and circuit scale without detriment to error correction capability. An error correction code (ECC) circuit of a solid state drive (SSD) performs first error correction on read data using a first error correction code (Hamming code), and further performs second error correction on the result of the first error correction using a second error correction code (BHC code). Furthermore, the ECC circuit performs third error correction on the result of the second error correction using a third error correction code (RS code).

7 Claims, 21 Drawing Sheets

U.S. PATENT DOCUMENTS

| | | |
|---|---|---|
| 2006/0256615 A1 | 11/2006 | Larson |
| 2007/0214395 A1 | 9/2007 | Shiota et al. |
| 2008/0163023 A1 | 7/2008 | Hong et al. |
| 2008/0301524 A1 | 12/2008 | Horisaki et al. |
| 2009/0222708 A1 | 9/2009 | Yamaga |

OTHER PUBLICATIONS

Office Action issued May 29, 2012 in Japanese Patent Application No. 2008-051419 with English translation.

* cited by examiner

FIRST ERROR INFORMATION
(S1 TO S8)

FIG.14

| 0 | 0 | 0 | 0 | 0 | 1 | 0 | 0 |
|---|---|---|---|---|---|---|---|
| 0 | 1 | 2 | 3 | 4 | 5 | 6 | 7 |

SECOND ERROR
INFORMATION
(S1 TO S8)

US 8,499,216 B2

SEMICONDUCTOR STORAGE DEVICE, METHOD OF CONTROLLING THE SAME, AND ERROR CORRECTION SYSTEM

CROSS REFERENCE TO RELATED APPLICATION

This application is a continuation application of and claims the benefit of priority under 35 U.S.C. §120 of U.S. Ser. No. 13/334,438, filed Dec. 22, 2011, which is a continuation of U.S. Ser. No. 12/867,068, now U.S. Pat. No. 8,086,933, filed Aug. 11, 2010, which is the National Stage Application of PCT/JP08/067,585, filed Sep. 19, 2008, and also claims the benefit of priority under 35 U.S.C. §119 from Japanese Patent Application No. 2008-051419, filed Feb. 29, 2008, the contents of which are incorporated herein by reference.

TECHNICAL FIELD

The present invention relates to a semiconductor storage device, a method of controlling the same, and an error correction system, and more particularly, to a semiconductor storage device including an error correction circuit that corrects an error of a semiconductor memory storing information in a nonvolatile manner, a method of controlling the same, and an error correction system.

BACKGROUND ART

Recently, there are widely known semiconductor memory devices such as flash memory that stores information depending on a held charge amount. A multi-value memory technology for storing two bits or more of information by setting a plurality of thresholds of the charge amount is also developed.

In the semiconductor memory devices, electric charge is discharged with passage of time, and thus, if the charge is discharged more than the threshold, an error may occur when information is read. Particularly, a multi-value type of memory device has generally narrow intervals between thresholds, and this causes the probability of occurrence of an error to increase.

Japanese Patent Application Laid-Open No. 2007-87464 discloses a storage device, using the semiconductor memory device, which includes an error correction mechanism to correctly recover incorrect information.

There is a case in which many errors may be included in data consisting of a plurality of bits caused by the passage of time since the last recording of the data, and even in this case, a correction mechanism having a high error correction capability is generally required to correct the errors. The correction mechanism having the high error correction capability requires a large circuit scale, a large power consumption, and a long time for processing. Generally, the correction mechanism having the high error correction capability is provided to ensure recovery of incorrect information to correct one even after a long time has passed since the last storage of the information. The high-performance error correction mechanism is uniformly applicable to storage devices irrespective of a length of the passage of time since the last storage of the information.

Consequently, even when information is to be read after the passage of only a short period of time since the storage thereof, the high-performance error correction mechanism is used. Therefore, the high-performance error correction mechanism is wastefully used even if the information to be read contains not so many errors. This leads to wasteful consumption of power for the storage device.

Besides, to increase the error correction capability, it is generally required to increase information as an object of error correction. An error correction code is generated using, for example, 4-kilobyte data in which a plurality of 512-byte data is connected to each other as a unit, instead of generation of an error correction code for, for example, 512-byte data. This technique enables the error correction capability to be increased. This technique, however, results in reading of 4-kilobyte data, although 512-byte data is wished to be read. This also forces the storage device to wastefully consume electric power.

It is an object of the present invention to provide a semiconductor storage device, a method of controlling the same, and an error correction system capable of reducing a power consumption and a circuit scale without detriment to the error correction capability.

DISCLOSURE OF INVENTION

To solve the problems and achieve the object, a semiconductor storage device according to an aspect of the present invention includes a temporary storage unit that can store therein a plurality of data blocks, arranged in a matrix, each formed of a plurality of data; an error-detection-code generating unit that generates an error detection code to detect an error for each data block; a first error-correction-code generating unit that generates a first error correction code to correct an error for each first unit data formed of the data block; a second error-correction-code generating unit that generates a second error correction code to correct an error for each second unit data formed of the data blocks arranged in a column direction; a third error-correction-code generating unit that generates a third error correction code to correct an error for each third unit data formed of the data blocks arranged in a row direction; and a nonvolatile semiconductor memory that can store therein the data blocks, generated error detection code, and generated first to third error correction codes.

A method of controlling semiconductor storage device according to another aspect of the present invention includes a host device; and a semiconductor storage device that perform read/write data from/to a nonvolatile memory according to an instruction of the host device, wherein the semiconductor storage device includes a temporary storage unit that divides data transferred from the host device into a plurality of data blocks each formed of a plurality of data, and stores therein the data blocks in a matrix; an error-detection-code generating unit that generates an error detection code to detect an error for each data block; a first error-correction-code generating unit that generates a first error correction code to correct an error for each first unit data formed of the data block; a second error-correction-code generating unit that generates a second error correction code to correct an error for each second unit data formed of the data blocks arranged in a column direction; a third error-correction-code generating unit that generates a third error correction code to correct an error for each third unit data formed of the data blocks arranged in a row direction; a nonvolatile semiconductor memory that can store therein the data blocks, generated error detection code, and generated first to third error correction codes; a first error correcting unit that performs first error correction on each of the data blocks using the first error correction code corresponding thereto; a first error detecting unit that detects an error in first error-corrected block using the error detection code corresponding thereto; a second error correcting unit that performs second error correction on an error in the first error-corrected block detected by the first error detecting unit, using the second error correction code corresponding thereto; and a second error detecting unit that detects an error in second error-corrected block using the error detection code corresponding thereto; and a transmitting unit that transmits the second error-corrected data and a result of detection by the second error detecting unit to the host device, and the host device includes a third error correcting unit that performs third error correction on an error in the second error-corrected block, received from the semiconductor storage device, detected by the second error detecting unit, using the third error correction code corresponding thereto.

BRIEF DESCRIPTION OF DRAWINGS

FIG. 14 is a schematic of an example of second error information;

BEST MODE(S) FOR CARRYING OUT THE INVENTION

Exemplary embodiments of the present invention will be explained in detail below with reference to the accompanying drawings. It should be noted that the present invention is not limited to the embodiments. Further, components in the following embodiments include those which can be thought of by persons skilled in the art or include substantially same components.

A first embodiment of the present invention allows reduction of a power consumption and a circuit scale by performing three types of correction coding with different error correction capabilities when error correction coding/decoding is applied to a memory such as a flash memory having a defective bit.

Figure 1:
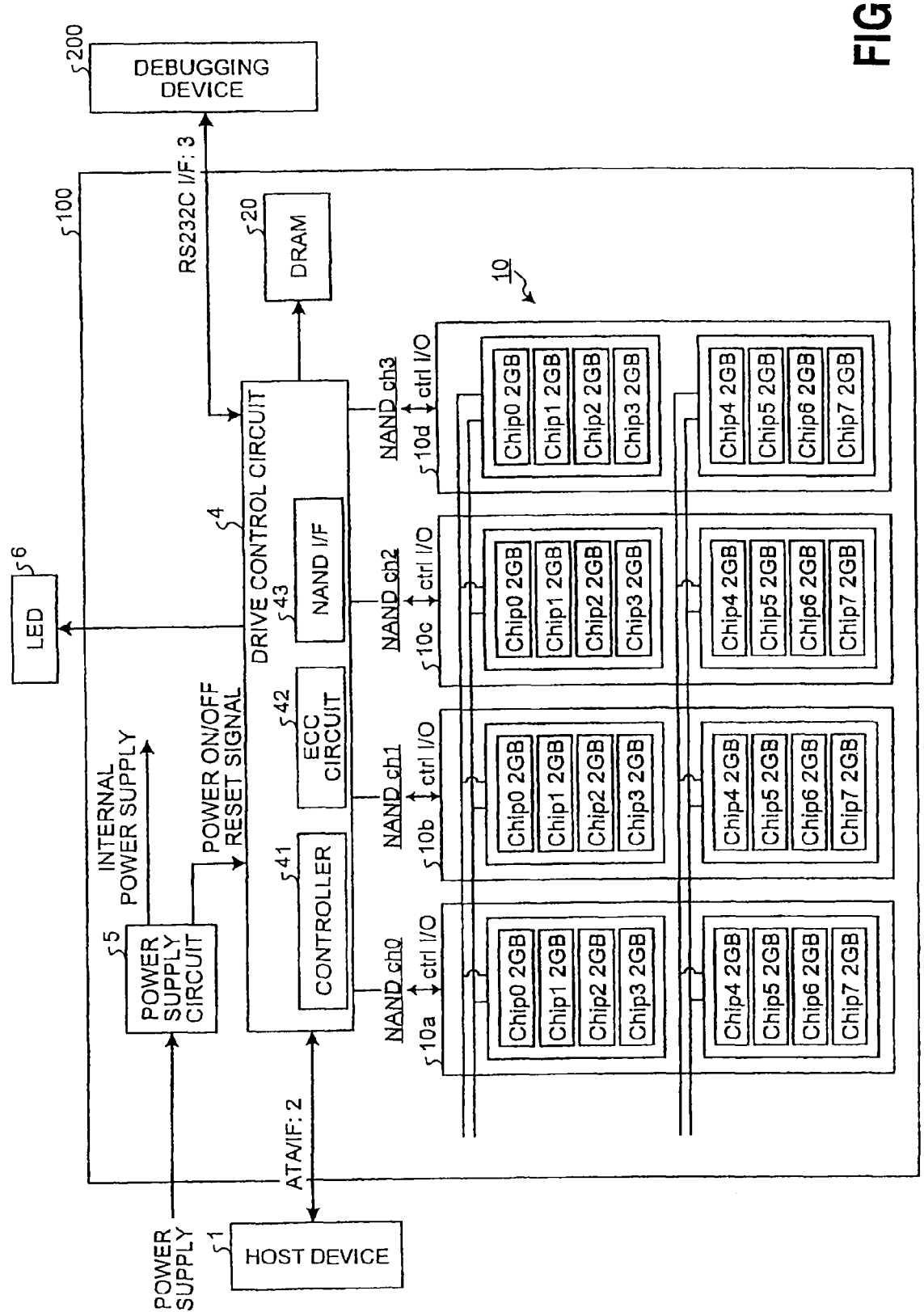
FIG. 1 is a block diagram of a configuration example of a solid state drive (SSD)

FIG. 1 is a block diagram of a configuration example of a solid state drive (SSD) 100. The SSD 100 is connected to a host device (host) 1 such as a personal computer or a central processing unit (CPU) core via a memory-connection interface such as an advanced technology attachment (ATA) interface (I/F) (ATA/IF) 2, so that the SSD 100 functions as an external memory of the host device 1. The SSD 100 can perform data transmission/reception with a debugging device 200 via a communication interface 3 such as an RS232C interface (RS232C I/F). The SSD 100 includes a NAND flash memory (hereinafter, "NAND memory") 10 being a nonvolatile memory, a drive control circuit 4 being a controller, a dynamic random access memory (DRAM) 20 being a volatile memory, a power supply circuit 5, and a light emitting diode (LED) 6 for status indication.

The power supply circuit 5 generates a plurality of different voltages of an internal direct-current power supply from an external direct-current power supply supplied from a power supply circuit provided in the side of the host device 1, and supplies these voltages to circuits in the SSD 100. Further, the power supply circuit 5 detects a rising edge or a falling edge of an external power supply, generates a power-on reset signal or a power-off reset signal, and supplies the signal to the drive control circuit 4.

In this case, the NAND memory 10 includes four parallel-operation elements 10a to 10d that perform four parallel operations, and each of the parallel-operation elements includes two NAND memory packages. Each of the NAND memory packages is formed of a plurality of stacked NAND memory chips (e.g., 2 gigabytes (GB) per chip). In FIG. 1, the NAND memory package is formed of four stacked NAND memory chips, and therefore the NAND memory 10 has a capacity of 64 gigabytes. If the NAND memory package is formed of eight stacked NAND memory chips, the NAND memory 10 has a capacity of 128 gigabytes.

The DRAM 20 functions as a data transfer cache between the host device 1 and the NAND memory 10 and also functions as a memory for work area.

The drive control circuit 4 controls data transfer via the DRAM 20 between the host device 1 and the NAND memory 10, and also controls the components in the SSD 100. The drive control circuit 4 has a function of supplying a status indication signal to the LED 6, receiving a power-one/off reset signal from the power supply circuit 5, and supplying the reset signal and a clock signal to the components in the own circuit and the SSD 100.

Figure 2:
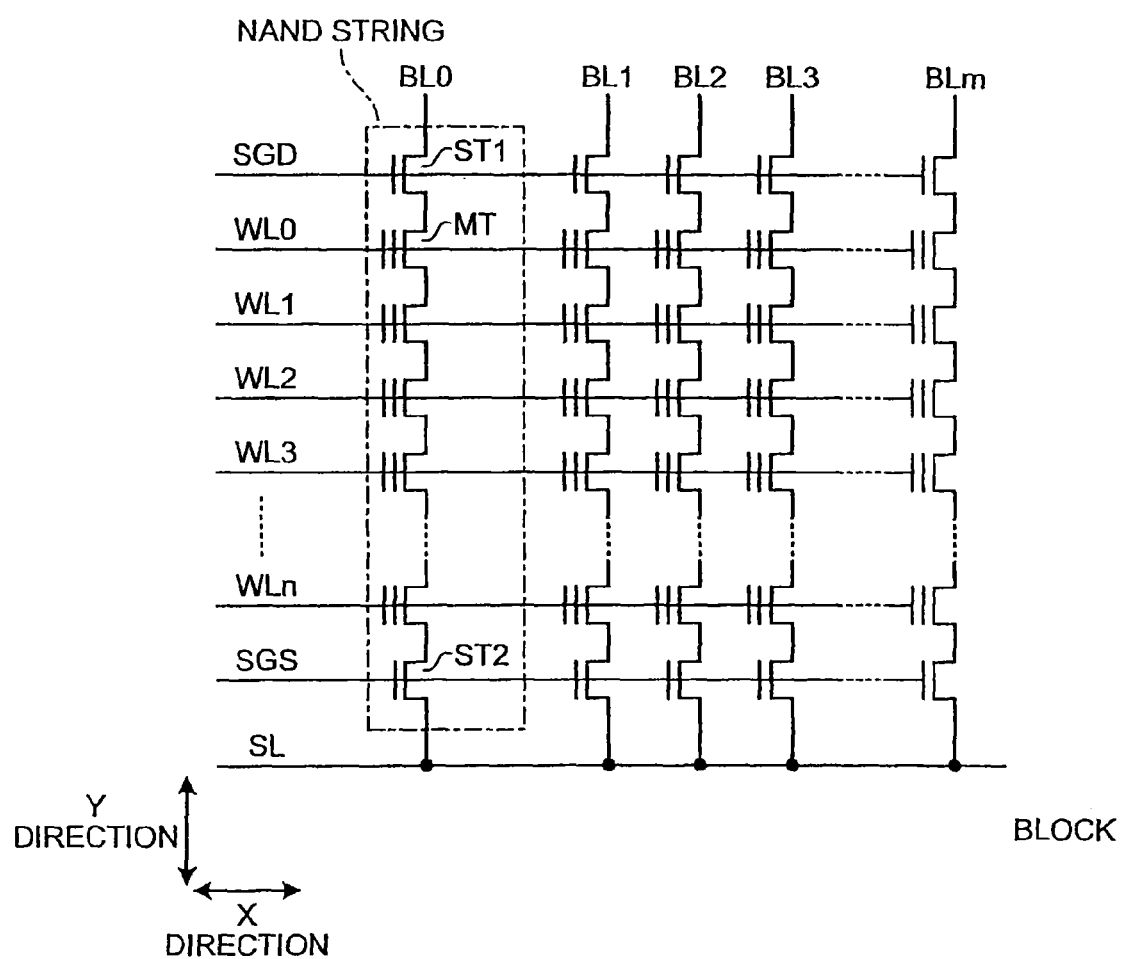
FIG. 2 is a circuit diagram of a configuration example of one block contained in a NAND memory chip.

The NAND memory chip is configured to arrange a plurality of blocks each as a unit of data deletion. FIG. 2 is a circuit diagram of a configuration example of one block contained in the NAND memory chip. The block includes (m+1) NAND strings (where m: an integer of zero or more) sequentially arranged along an X direction. Selection transistors ST1 respectively contained in the (m+1) NAND strings are connected to bit lines BL0 to BLm at their drains, and are commonly connected to a selection gate line SGD at their gates, respectively. Selection transistors ST2 are commonly connected to a source line SL at their sources, and are commonly connected to a selection gate line SGS at their gates, respectively.

A memory cell transistor MT is formed of a metal-oxide-semiconductor field-effect transistor (MOSFET) that includes a stacked gate structure formed on a semiconductor substrate. The stacked gate structure has a charge storage layer (floating gate electrode) formed on the semiconductor substrate via a gate insulation film, and a control-gate electrode formed on the charge storage layer via an inter-gate insulation film. The memory cell transistor MT causes a threshold voltage to change according to the number of electrons stored in the floating gate electrode, and stores therein data according to a difference in the threshold voltage. The memory cell transistor MT may be configured so as to store one bit, or may be configured so as to store multiple values (2 bits or more of data).

In the NAND string, (n+1) memory cell transistors MT are arranged between the source of the selection transistor ST1 and the drain of the selection transistor ST2 so that current paths thereof are connected in series. More specifically, a plurality of memory cell transistors MT is serially connected in a Y direction in such a manner that a diffusion region (a source region or a drain region) is shared by adjacent transistors.

The control-gate electrodes are sequentially connected to word lines WL0 to WLn in the order from the memory cell transistor MT located at the closest to the selection transistor ST1. Thus, the drain of the memory cell transistor MT connected to the word line WL0 is connected to the source of the selection transistor ST1, while the source of the memory cell transistor MT connected to the word line WLn is connected to the drain of the selection transistor ST2.

The control-gate electrodes of the memory cell transistors MT in the NAND strings of the block are commonly connected to each of the word lines WL0 to WLn. That is, the control-gate electrodes of the memory cell transistors MT in a same raw of the block are connected to a same word line WL. The (m+1) memory cell transistors MT connected to the same word line WL are handled as one page, and writing and reading of data are performed for each page.

The drain of the selection transistor ST1 in each of the bit lines BL0 to BLm is commonly connected to another block. Namely, NAND strings in a same column of a plurality of blocks are connected to a same bit line BL.

As shown in FIG. 1, in the NAND memory 10, the four parallel-operation elements (NAND packages) 10a to 10d are connected to the drive control circuit 4 in parallel via four channels (ch 0 to ch 3) each with 8 bits. Following three types of access modes are provided based on whether the four parallel-operation elements 10a to 10d are operated singly or in parallel, and based on a combination of one of these two with whether a double-speed mode of the NAND memory 10 is used.

(1) 8-bit normal mode
One channel is operated to read/write data in 8-bit units. A size unit of data transfer is a page size (4 kilobytes).

(2) 32-bit normal mode
Four channels are operated in parallel to read/write data in 32-bit units. A size unit of data transfer is a page size×4 (16 kilobytes).

(3) 32-bit double-speed mode
Four channels are operated in parallel, and further the double-speed mode of the NAND memory 10 is used to read/write data. A size unit of data transfer is a page size×4×2 (32 kilobytes).

In the 32-bit normal mode or the 32-bit double-speed mode in which the four channels are operated in parallel, four or eight blocks that operate in parallel are determined as a unit of deletion of the NAND memory 10, and four or eight pages that operate in parallel are determined as a unit of writing and a unit of reading to and from the NAND memory 10.

The drive control circuit 4 includes a controller 41, an error-correction code (ECC) circuit 42, and an NAND I/F 43.

The controller 41 performs data transmission/reception with the host device 1 via the ATA interface 2 and also access control to the DRAM 20.

The NAND I/F 43 performs an interface process with (or performs input/output control (ctrl I/O) to/from) each of the NAND packages 10a to 10d of the NAND memory 10.

The ECC circuit 42 generates an error detection code and an error correction code for data to be written to the NAND memory 10. The ECC circuit 42 also performs error detection and error correction on data read from the NAND memory 10.

An overview of the operation of the SSD 100 configured as above is explained below. When data requested to be written (write data) is supplied from the host device 1 to the SSD 100, the controller 41 temporarily stores the write data in the DRAM 20. The controller 41 supplies the stored write data to the ECC circuit 42 by each predetermined unit. The ECC circuit 42 generates an error correction code and an error detection code for the write data. The NAND I/F 43 writes the write data with the error correction code and the error detection code added thereto to the NAND memory 10.

In the SSD 100, when a data read request is input from the host device 1, the NAND I/F 43 reads the data requested to be read (read data), also reads the error correction code and the error detection code which are added to the data, and supplies the data with the codes to the ECC circuit 42. The ECC circuit 42 performs error detection and error correction on the read data. The controller 41 stores the error-corrected data in the DRAM 20, and then transfers the data to the host device 1.

A basic operation procedure of the ECC circuit 42 is explained below. The ECC circuit 42 performs three types of error coding having different error correction capabilities on the data to be written to the NAND memory 10, to thereby allow reduction in power consumption and circuit scale. A first error correction code (ECC 1 in FIG. 6) is used to perform error correction on a data block D basis. A second error correction code (ECC 2 in FIG. 6) is used to perform column-by-column error correction, the column being formed of a plurality of data blocks D. A third error correction code (RS in FIG. 6) is used to perform row-by-row error correction, the row being formed of a plurality of data blocks D. Levels of error correction capabilities of the three are provided in an ascending order as follows: first error correction code< second error correction code<third error correction code.

Figure 3:
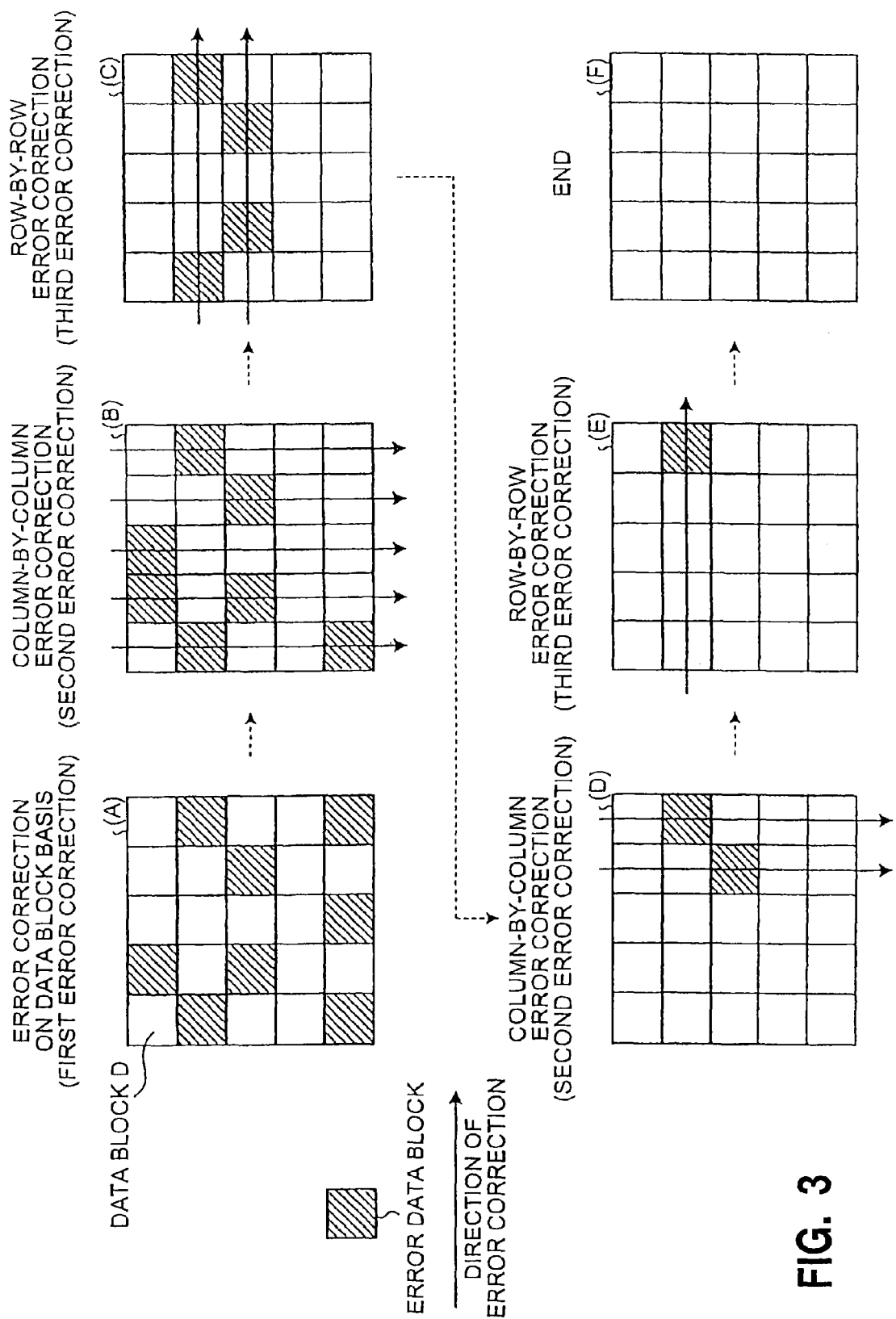
FIG. 3 is a schematic diagram for explaining an outline of the principle of error correction in an error correction code (ECC) circuit.

FIG. 3 is a schematic diagram for explaining an outline of the principle of error correction in the ECC circuit 42. FIG. 3 represents data read from the NAND memory 10, and data blocks D each formed of a plurality of data are arranged in a matrix. A shaded area represents an error data block containing error data. First, error correction (first error correction) is performed on a data block D basis (A). Next, column-by-column error correction (second error correction of a first round) is performed on data blocks D in which an error or errors cannot be corrected (B). Further, row-by-row error correction (third error correction of the first round) is performed on data blocks D in which an error or errors cannot be corrected (C). Column-by-column error correction (second error correction of a second round) is again performed on data blocks D in which an error or errors cannot be corrected (D). Further, row-by-row error correction (third error correction of the second round) is performed on data blocks D in which an error or errors cannot be corrected (E). With these operations, data with no error are decoded (F).

As explained above, in the first embodiment, the error correction (first error correction) is first performed on the data block basis. If there is any data block in which an error cannot be corrected, the column-by-column error correction (second error correction) and the row-by-row error correction (third error correction) are alternately repeated until the error is eliminated, and data with no error are decoded.

Figure 4:
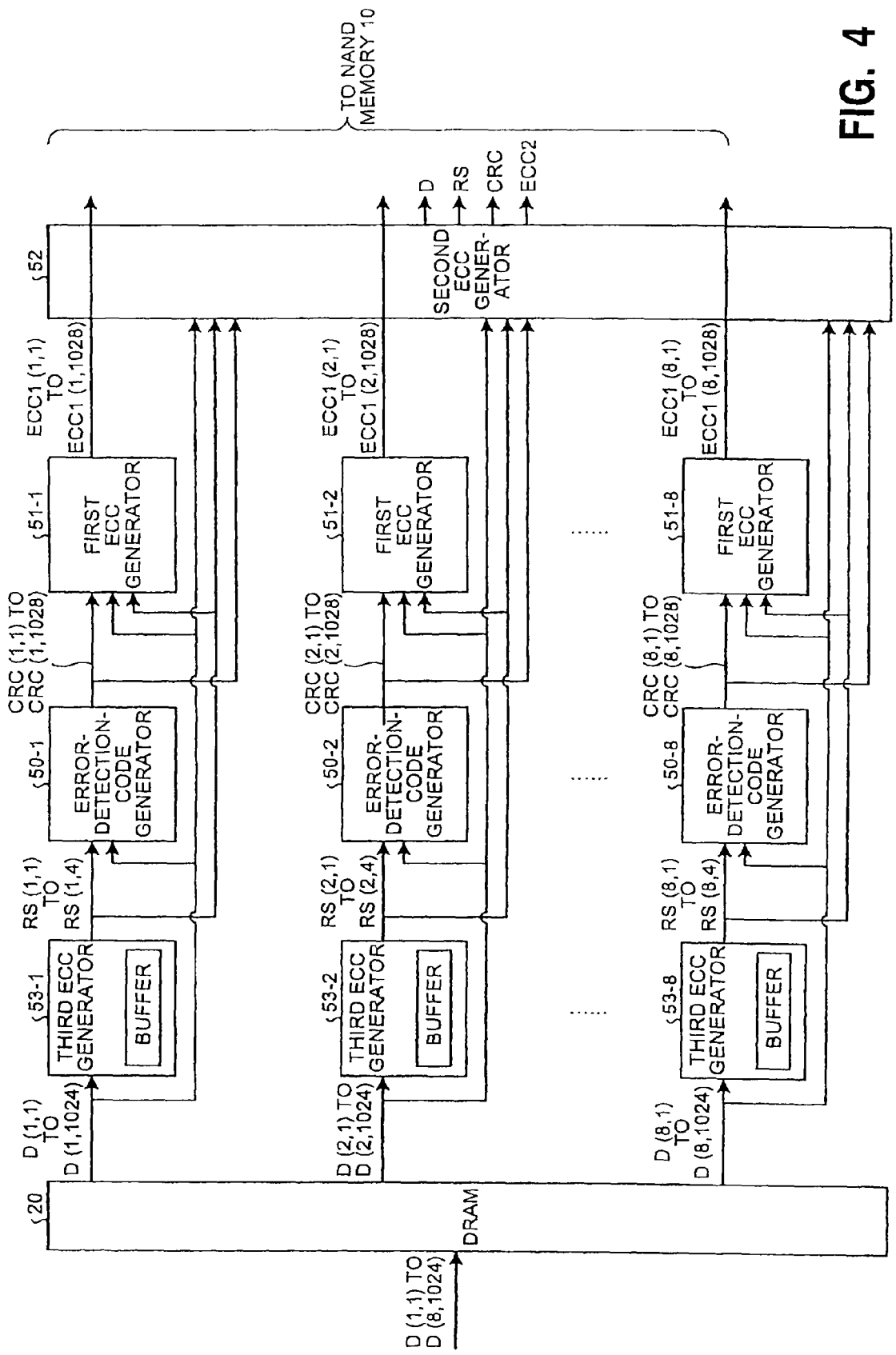
FIG. 4 is a block diagram of a main portion of a coding system in the ECC circuit.
Figure 5:
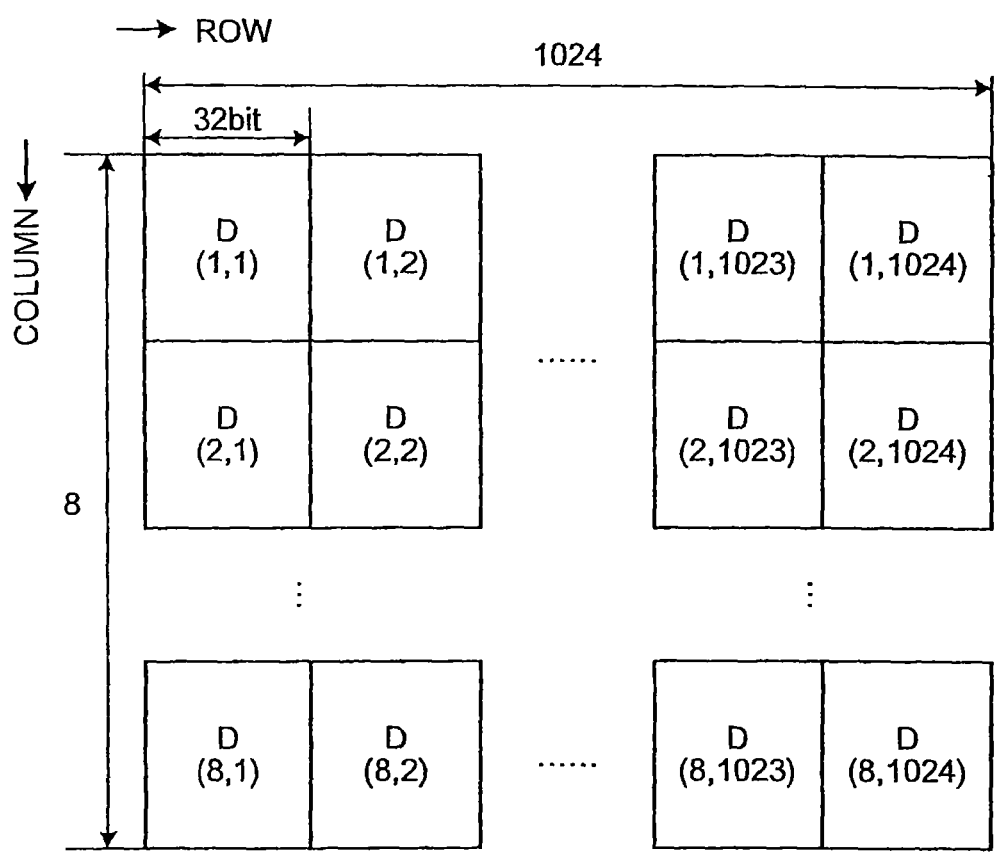
FIG. 5 is a schematic diagram of an example of a format of data stored in DRAM.
Figure 6:
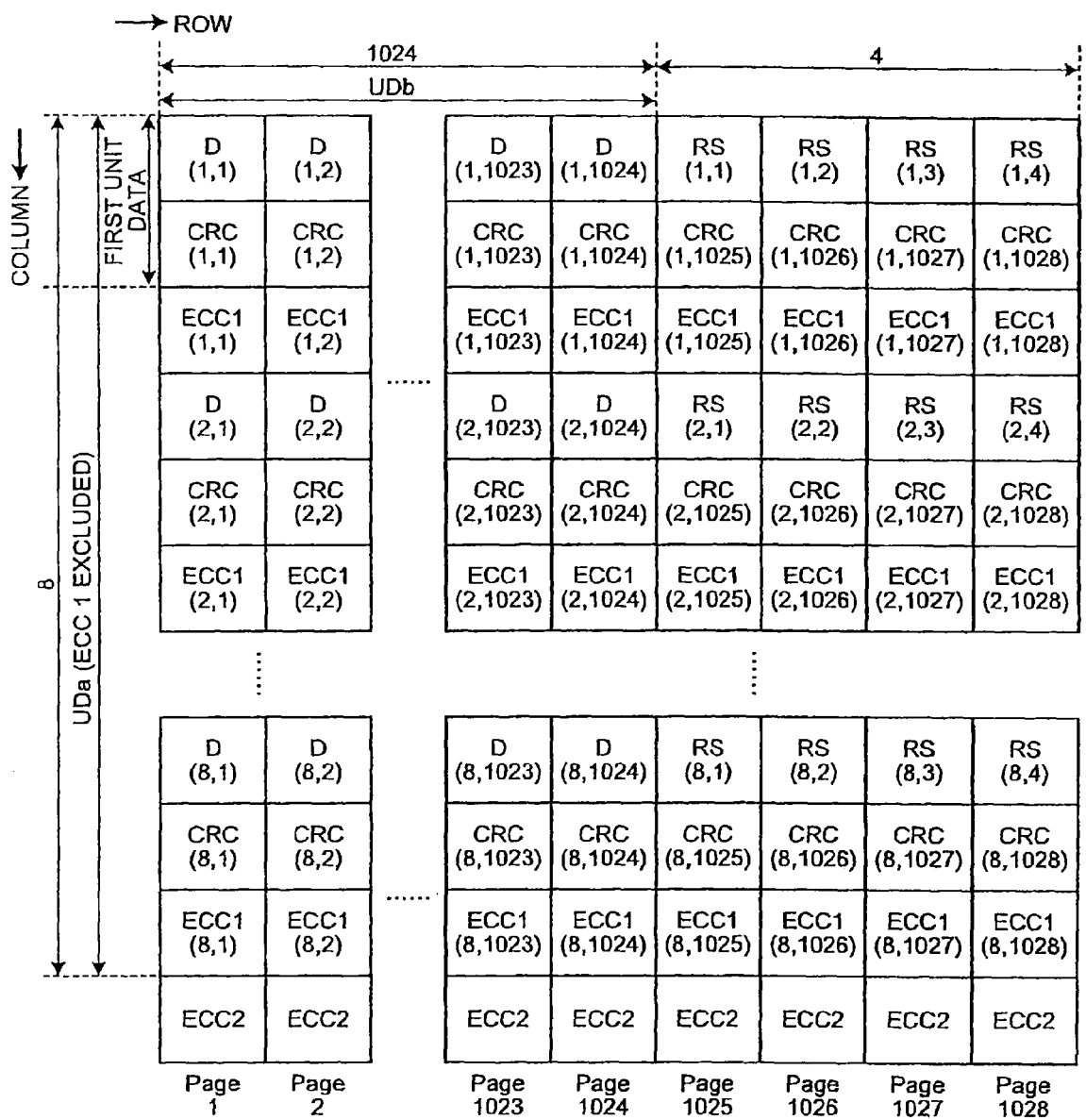
FIG. 6 is a schematic diagram of a format of data transferred to a NAND memory.

FIG. 4 is a block diagram of a main portion of a coding system in the ECC circuit 42. FIG. 5 is a schematic diagram of an example of a format when data to be transferred from the host device 1 is stored in the DRAM 20. FIG. 6 is a schematic diagram of a format of data transferred to the NAND memory 10.

As shown in FIG. 4, the ECC circuit 42 includes eight error-detection-code generators 50-1 to 50-8 (error-detection-code generating units), eight first ECC generators 51-1 to 51-8 (first error-correction-code generating units), a second ECC generator 52 (second error-correction-code generating unit), and eight third ECC generators 53-1 to 53-8 (third error-correction-code generating units).

Each of the error-detection-code generators 50-1 to 50-8 (or they may be represented as error-detection-code generator 50) generates an error detection code to detect an error in each data block D of write data. The size of the data block D is, for example, 512 bytes.

As the error detection code, cyclic redundancy checksum (CRC)-32, CRC-16, or the like can be used. The first embodiment uses the CRC-32, and the size of the CRC-32 (hereinafter, "CRC") is set to 4 bytes. Any generally known device can be used as the error-detection-code generator 50, and thus, detailed explanation thereof is omitted.

Each of the first ECC generators 51-1 to 51-8 (or they may be represented as first error-detection-code generator 51) generates the first error correction code to correct an error in each first unit data formed of a data block D and a corresponding error detection code.

As the first error correction code, an error correction code, for example, Hamming code and BCH code (Bose-Chaudhuri-Hocquenghem code) can be used so as to enable correction of an error in one bit or in a plurality of bits. The first embodiment uses the Hamming code as the first error correction code, and the size of the Hamming code is set to 4 bytes. Any generally known device can be used as the first ECC generator 51, and thus, detailed explanation thereof is omitted.

The second ECC generator 52 generates the second error correction code for each second unit data UDa formed of a plurality of first unit data arranged in the column direction. The number of write data as a unit of generating the second error correction code is decided according to error correction capability desired to be achieved and an error correction code to be used.

As the second error correction code, an error correction code having higher error correction capability as compared with that of the first error correction code is used, and an error correction code allowing error correction of a plurality of bits is used. Specifically, the BCH code and low-density parity check (LDPC) code or the like can be used. The first embodiment is configured to generate a BCH code for each second unit data UDa formed of eight first unit data arranged in the column direction, and to set the size of the BCH code to 24 bytes. Any generally known device can be used as the second ECC generator 52, and thus, detailed explanation thereof is omitted.

Each of the third ECC generators 53-1 to 53-8 (or they may be represented as third ECC generator 53) generates the third error correction code for each third unit data UDb formed of a plurality of data blocks D arranged in the row direction. The number of data blocks D as a unit of generating the third error correction code is decided according to error correction capability desired to be achieved and an error correction code to be used.

As the third error correction code, an error correction code allowing error correction with higher capability as compared with that of the error correction using the second error correction code, which performs error correction of a plurality of bits, is used. More specifically, a Reed-Solomon (RS) code or the like can be used as the third error correction code. The first embodiment is configured to generate an RS code for each third unit data UDb formed of 1024 first unit data D, and to set the size of the RS code to 512 bytes the same as the data block D. The third ECC generator 53 generates, for example, four RS codes for each third unit data UDb. Therefore, it is possible to correct errors in four write data out of 1024 data blocks D that constitute the third unit data UDb. Any generally known device can be used as the third ECC generator 53, and thus, detailed explanation thereof is omitted.

When receiving write data D (1, 1) through D (8, 1024) from the host device 1, as shown in FIG. 5, the controller 41 sequentially stores eight data blocks D (1, p) to D (8, p) as a unit of processing of the first ECC generator 51 in the column direction in the DRAM 20, stores the 1024 first unit data D (q, 1) to D (q, 1024) as a unit of processing of the third ECC generator 53 in the DRAM 20, and sequentially transfers the stored data column by column to the ECC circuit 42. Where p is an arbitrary number of 1 to 1024 and q is an arbitrary number of 1 to 8.

The eight error-detection-code generators 50-1 to 50-8 are provided corresponding to the eight data blocks D (1, p) to D (8, p) arranged in the column direction, respectively. The eight error-detection-code generators 50-1 to 50-8 generate eight CRCs for the eight data blocks D (1, p) to D (8, p), respectively. The eight CRCs are used to detect errors in the eight data blocks D (1, p) to D (8, p) corresponding thereto. The eight CRCs are output to the first ECC generators 51-1 to 51-8 respectively and to the second ECC generator 52. It is noted that the error-detection-code generators 50-1 to 50-8 generate CRCs for eight RS (1, r) to RS (8, r) arranged in the column direction, respectively, where r is an arbitrary number of 1 to 4.

The eight first ECC generators 51-1 to 51-8 are provided corresponding to the eight data blocks D (1, p) to D (8, p) arranged in the column direction respectively. The eight first ECC generators 51-1 to 51-8 generate Hamming codes for each first unit data, or from the eight data blocks D (1, p) to D (8, p) and from the eight CRC (1, p) to CRC (8, p) respectively. The eight Hamming codes are used for the first error correction of the corresponding eight unit data D (1, p) to D (8, p) respectively. The eight Hamming codes are output to the second ECC generator 52. The first ECC generators 51-1 to 51-8 generate Hamming codes for eight RS (1, r) to RS (8, r) and the corresponding eight CRCs arranged in the column direction respectively, where r is an arbitrary number of 1 to 4.

The second ECC generator 52 generates one BCH code for each second unit data UDa formed of the eight first unit data arranged in the column direction, or for the data blocks D (1, p) to D (8, p) and the corresponding eight CRC (1, p) to CRC (8, p). The BCH code is used for error correction in the second unit data UDa (ECC 1 (1, p) to ECC 1 (8, p) are excluded). In the first embodiment, the size of data formed of the second unit data UDa and the BCH code corresponds to one page (minimum access unit to the NAND memory 10).

The third ECC generator 53 generates four RS codes for each third unit data UDb formed of the 1024 data blocks D (q, 1) to D (q, 1024) arranged in the row direction. The eight third ECC generators 53-1 to 53-8 are provided corresponding to the rows of write data stored in the DRAM 20. The third ECC generator 53 includes a buffer that stores therein the third unit data UDb. Specifically, the third ECC generator 53-1 generates four RS (1, 1) to RS (1, 4) for third unit data UDb 1 formed of data D (1, 1) to D (1, 1024). The same goes for the third ECC generators 53-2 to 53-8 corresponding to the second to the eighth rows respectively.

The data blocks D, CRCs, Hamming codes, BCH codes, and RS codes are transferred to the NAND memory 10 through the NAND I/F 43 for each page shown in FIG. 6. The NAND memory 10 stores therein these data in order of pages. For example, when one memory block is formed of 1028 pages, the data shown in FIG. 6 is stored in one memory block in the NAND memory 10 (in the 8-bit normal mode). However, in 32-bit mode (the 32-bit normal mode or the 32-bit double-speed mode), these data are written in parallel to memory chips of each channel.

An error-detection-code generation operation and an error-correction-code generation operation of the ECC circuit 42 upon data write operation will be explained below with reference to FIG. 4 through FIG. 9.

First, referring to FIG. 5, the controller 41 sequentially writes data, as an object to be written to the NAND memory 10, to the DRAM 20 for each eight data blocks D (1, p) to D (8, p) in the column direction, to store the data blocks D (1, 1) through D (8, 1024) therein, and sequentially outputs the stored eight data blocks D (1, 1) through D (8, 1024) column by column to the error-detection-code generators 50-1 to 50-8, the first ECC generators 51-1 to 51-8, the second ECC generator 52, and to the third ECC generators 53-1 to 53-8, respectively.

Figure 7:
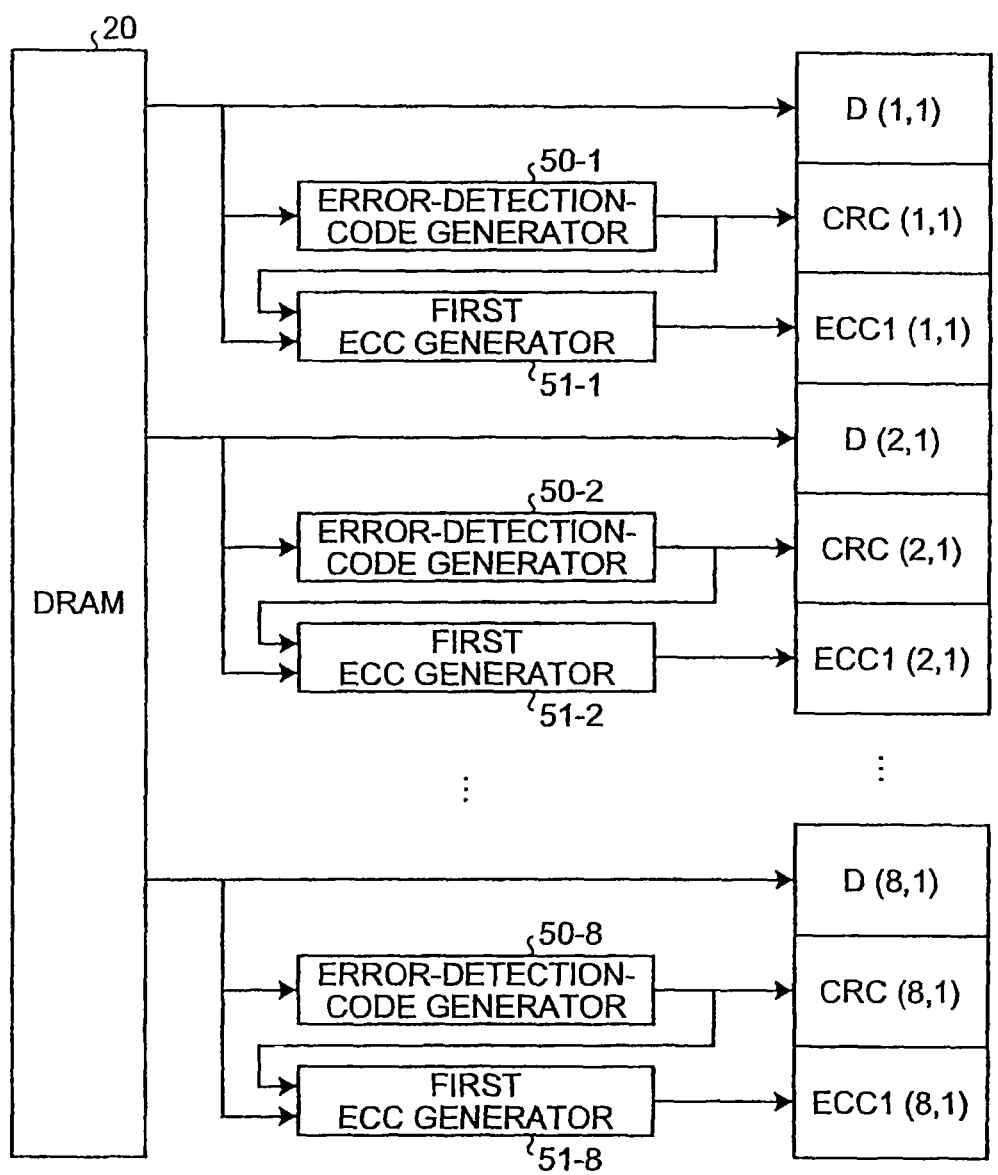
FIG. 7 is a schematic diagram for explaining an error-detection-code generation operation and an error-correction-code generation operation of the ECC circuit.

Then, as shown in FIG. 7, the error-detection-code generators 50-1 to 50-8 generate eight error detection codes CRC (1, 1) to CRC (8, 1) corresponding to the received eight data blocks D (1, 1) to D (8, 1), respectively. The first ECC generators 51-1 to 51-8 generate Hamming codes ECC 1 (1, 1) to ECC 1 (8, 1) from the eight write data D (1, 1) to D (8, 1) and the eight CRC (1, 1) to CRC (8, 1), respectively.

Figure 8:
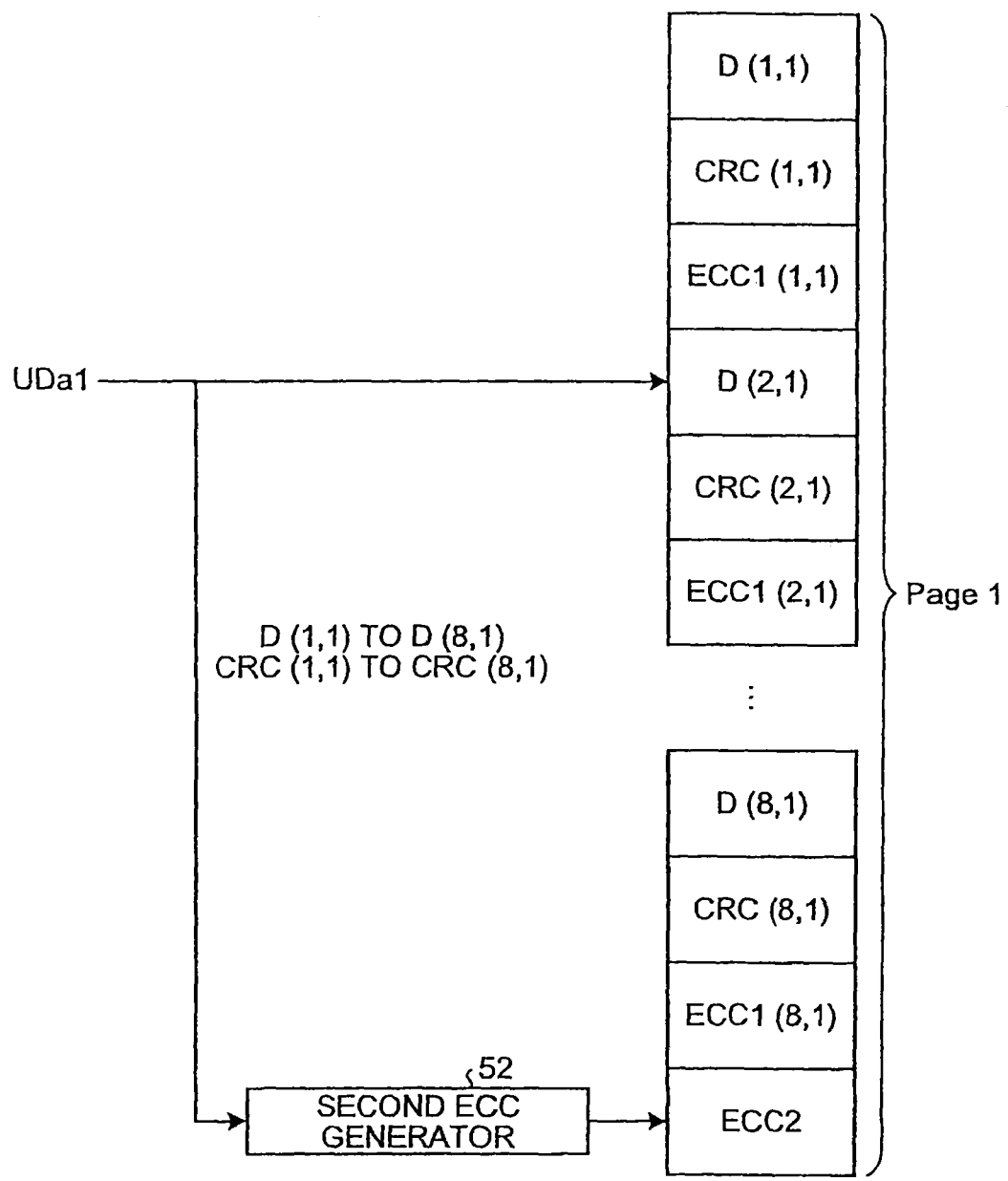
FIG. 8 is a schematic diagram continued from FIG. 7.

Subsequently, as shown in FIG. 8, second unit data UDa 1 formed of the eight data blocks D (1, 1) to D (8, 1) and the corresponding eight error detection codes CRC (1, 1) to CRC (8, 1) is output to the second ECC generator 52. The second ECC generator 52 uses the second unit data UDa 1 to generate BCH code ECC 2 to correct an error in the second unit data UDa 1. The BCH code ECC 2 is connected to the end of the second unit data UDa 1, to form page 1 (Page 1). The Page 1 is stored in the NAND memory 10.

The data shown in FIG. 6 for Page 2 to Page 1024 are generated in the same generation operation as above. The Page 2 to Page 1024 are stored in the NAND memory 10.

Figure 9:
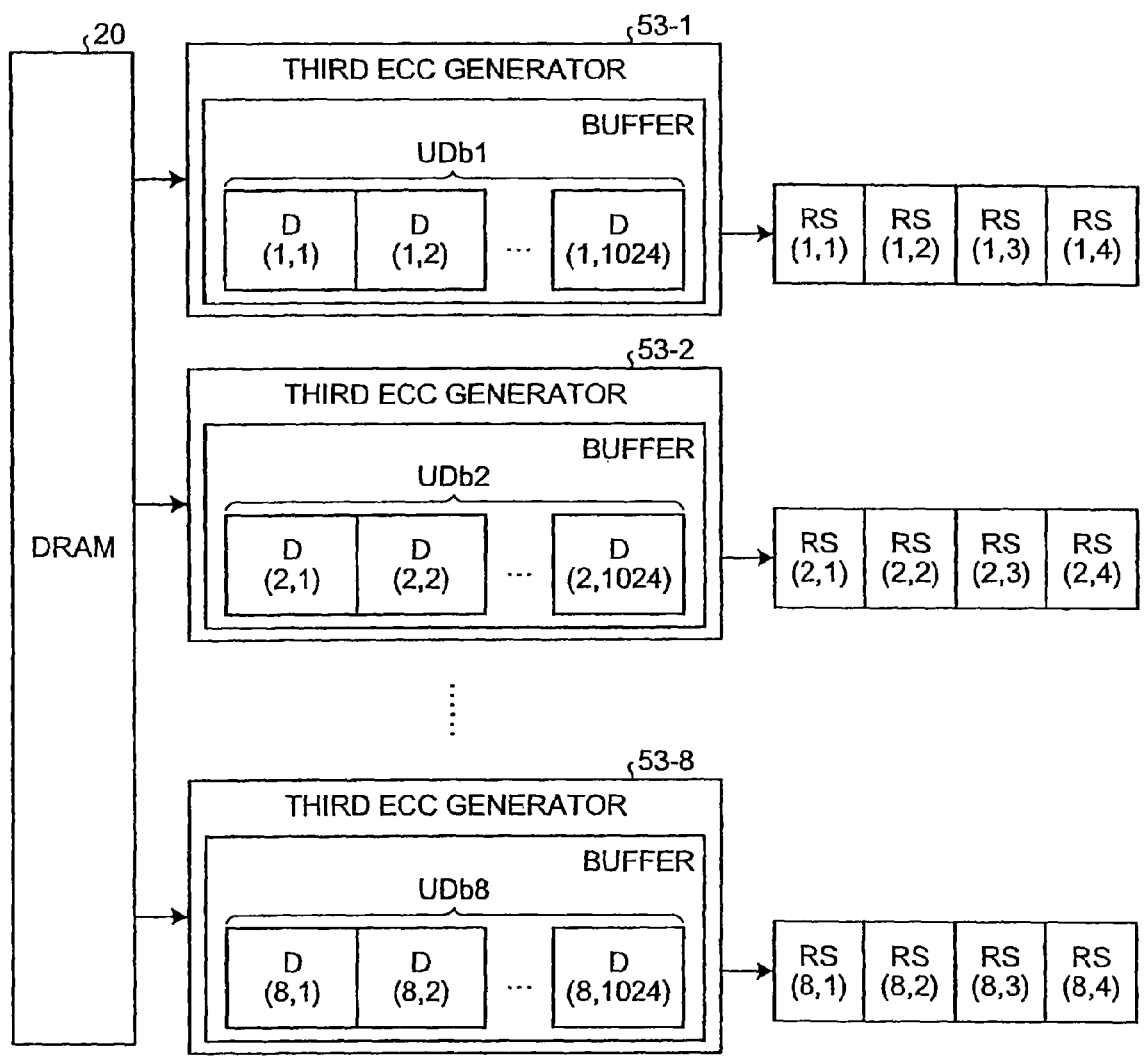
FIG. 9 is a schematic diagram continued from FIG. 8.

As shown in FIG. 9, the third ECC generators 53-1 to 53-8 sequentially store the received first unit data D (1, p) to D (8, p) in buffers column by column respectively, and use third unit data UDb 1, UDb 2, . . . UDb 8 to generate four RS (q, 1) to RS (q, 4), respectively. More specifically, the third ECC generator 53-1 uses the third unit data UDb 1 to generate four RS (1, 1) to RS (1, 4). The RS generation operations performed by the third ECC generators 53-2 to 53-8 are the same as that of the third ECC generator 53-1. In the first embodiment, the third ECC generators 53-1 to 53-8 perform the error-correction-code generation operations in parallel with each other. The parallel operation of the third ECC generators 53-1 to 53-8 allows reduction in processing time.

When the RS code is used, four redundancy codes are used to generally obtain two error location information and two error correction information, and thus two errors can be corrected. In the first embodiment, however, CRC is separately used to identify an error location of a data block D. Therefore, in the first embodiment, four errors can be corrected using the four redundancy codes. Specifically, it is possible to correct four errors in 1024 data blocks D (1, 1) to D (1, 1024).

Subsequently, the error-detection-code generators 50-1 to 50-8 generate CRC (1, 1025) through CRC (8, 1028) for each RS (1, 1) through RS (8, 4) respectively, similarly to the data blocks D. The first ECC generators 51-1 to 51-8 generate Hamming codes (1, 1025) through (8, 1028) for each RS (1, 1) through RS (8, 4) and each CRC (1, 1025) through CRC (8, 1028), respectively. Furthermore, the second ECC generator 52 generate BCH codes ECC 2 for RS (1, 1) through RS (8, 4) and the corresponding CRC (1, 1025) through CRC (8, 1028), respectively, and the BCH codes ECC 2 are connected to the ends of these codes respectively, to form Page 1025 to Page 1028. The Page 1025 to Page 1028 are transferred to the NAND memory 10 and stored therein. With these operations, the data as shown in FIG. 6 are generated.

Figure 10:
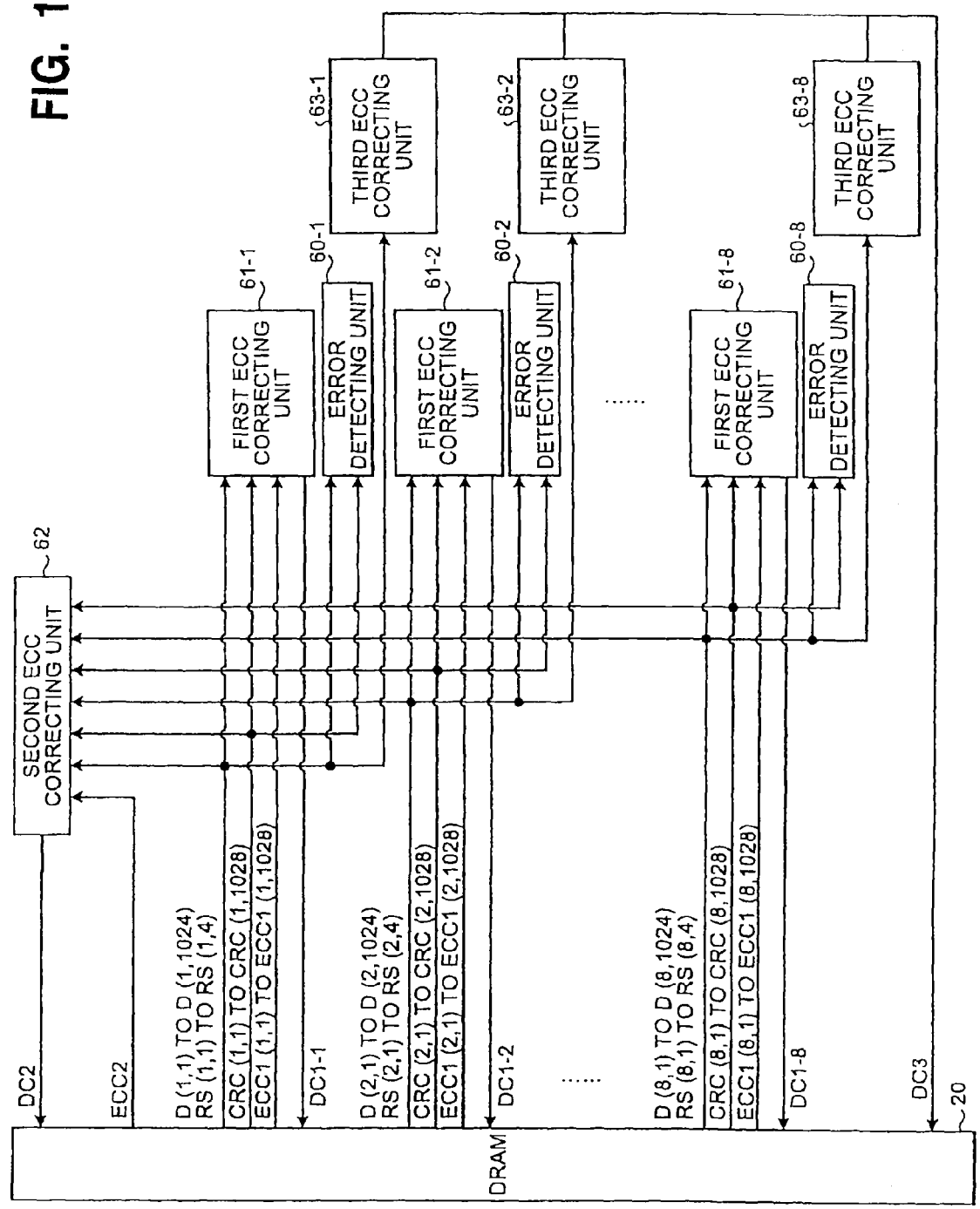
FIG. 10 is a block diagram of a main portion of a decoding system in the ECC circuit.

FIG. 10 is a block diagram of a main portion of a decoding system in the ECC circuit 42. FIG. 11 through FIG. 19 are schematics for explaining data reading in the ECC circuit 42. As shown in FIG. 10, the ECC circuit 42 includes eight error detecting units 60-1 to 60-8, eight first ECC correcting units 61-1 to 61-8, a second ECC correcting unit 62, and eight third ECC correcting units 63-1 to 63-8. In this figure, the controller 41 and the NAND I/F 43 are omitted to simplify the explanation.

In the SSD 100, when a data read request is input from the host device 1, the block data (data shown in FIG. 6) stored in one memory block of the NAND memory 10 is read through the NAND I/F 43 (in the 8-bit normal mode), and the controller 41 stores the read block data in the DRAM 20. Specifically, the DRAM 20 stores therein the block data shown in FIG. 6. It is noted that in the 32-bit mode (the 32-bit normal mode or the 32-bit double-speed mode), block data are read in parallel from memory chips of the channels.

The eight first ECC correcting units 61-1 to 61-8 (or they may be represented as first ECC correcting unit 61) are provided corresponding to the eight data blocks D (1, p) to D (8, p) and the corresponding CRC (1, p) to CRC (8, p) arranged in the column direction, or provided corresponding to the number of rows.

The first ECC correcting units 61-1 to 61-8 perform first error correction on the eight data blocks D (1, p) to D (8, p) and the CRC (1, p) to CRC (8, p) arranged in the column direction using the Hamming codes ECC 1 (1, p) to ECC 1 (8, p), respectively, and update data, among the data stored in the DRAM 20, corresponding to first error-corrected data DC 1-1 to DC 1-8 (FIG. 10). Likewise, the first ECC correcting units 61-1 to 61-8 perform the first error correction on the RS (1, 1) through RS (8, 4) and the corresponding CRC (1, 1025) through CRC (8, 1028), respectively. Any generally known device can be used as the first ECC correcting unit 61, and thus, detailed explanation thereof is omitted.

The eight error detecting units 60-1 to 60-8 (or they may be represented as error detecting unit 60) are provided corresponding to the eight data blocks D (1, p) to D (8, p) and the corresponding CRC (1, p) to CRC (8, p) arranged in the column direction, or provided corresponding to the number of rows.

The error detecting units 60-1 to 60-8 detect errors in the first unit data D (1, p) to D (8, p) using the eight CRC (1, p) to CRC (8, p) generated for the eight data blocks D (1, p) to D (8, p), respectively. Any generally known device can be used as the error detecting unit 60, and thus, detailed explanation thereof is omitted.

The second ECC correcting unit 62 performs second error correction in the second unit data formed of the eight first unit data D (1, p) to D (8, p) and the corresponding eight CRC (1, p) to CRC (8, p) using the BCH code ECC 2 generated for each page, and updates data, among the data stored in the DRAM 20, corresponding to second error-corrected data DC 2. The second error correction is performed on Pages 1025 to 1028 in the same manner as above.

The eight third ECC correcting units 63-1 to 63-8 (or they may be represented as third ECC correcting unit 63) are provided corresponding to the eight first unit data D (1, p) to D (8, p) arranged in the column direction. The third ECC correcting unit 63-1 uses four RS (1, 1) to RS (1, 4) to perform third error correction in the third unit data UDb 1 formed of 1024 read data D (1, 1) to D (1, 1024) arranged in the row direction. Likewise, the third ECC correcting units 63-2 to 63-8 perform the third error correction in the third unit data UDb 2 to UDb 8. Any generally known device can be used as the third ECC correcting unit 63, and thus, detailed explanation thereof is omitted.

In the first embodiment, all the four Reed-Solomon codes RS (1, 1) to RS (1, 4) are used for error correction. Therefore, the third ECC correcting unit 63-1 can recover four read data among the 1024 read data D (1, 1) to D (1, 1024). The same goes for the third ECC correcting units 63-2 to 63-8 corresponding to the second to the eighth rows respectively. Third error-corrected data DC 3 corrected by the third ECC correcting units 63-1 to 63-8 is transferred to the DRAM 20, and data, among the data stored in the DRAM 20, corresponding to the third error-corrected data DC 3 is updated.

Data of the data blocks D (1, 1) through D (8, 1024) corrected by the first ECC correcting units 61-1 to 61-8, the second ECC correcting unit 62, and by the third ECC correcting units 63-1 to 63-8 are transferred to the host device 1 by the controller 41.

An error detection operation and an error correction operation of the ECC circuit 42 upon data read operation will be explained below with reference to FIG. 11 through FIG. 19.

Before the error correction operation, the block data (data shown in FIG. 6) stored in one memory block of the NAND memory 10 is transferred to the DRAM 20 (in the 8-bit normal mode). Namely, the DRAM 20 stores therein the block data shown in FIG. 6.

The data of Page 1 to Page 1028 are sequentially transferred page by page (excluding BCH codes ECC 2) to the first ECC correcting units 61-1 to 61-8 respectively. The first ECC correcting units 61-1 to 61-8 use Hamming codes ECC 1 (1, 1) through ECC 1 (8, 1028) to perform first error correction on the data blocks D (1, 1) through D (8, 1024) and the corresponding CRC (1, 1) through CRC (8, 1024), and also on the RS (1, 1) through RS (8, 4) and the corresponding CRC (1, 1025) through CRC (8, 1028) page by page, and the first error-corrected data DC1-1 to DC1-8 are stored in the DRAM 20.

Subsequently, the error detecting unit 60 performs an error detection operation. More specifically, first error-corrected first unit data D (1, 1) through D (8, 1024) and the corresponding CRC (1, 1) through CRC (8, 1024), and first error-corrected RS (1, 1) through RS (8, 4) and the corresponding CRC (1, 1025) through CRC (8, 1028) are transferred page by page from the DRAM 20 to the error detecting units 60-1 to 60-8, respectively.

The error detecting units 60-1 to 60-8 detect errors, page by page, in the first error-corrected data blocks D (1, 1) through D (8, 1024) and in the first error-corrected RS (1, 1) through RS (8 4) using the corresponding CRC (1, 1) through CRC (8, 1028), respectively. The error detecting units 60-1 to 60-8 generate first error information S1 to S8, page by page, indicating in which read data block D and RS code RS an error exists as results of error detection, respectively. The first error information S1 to S8 are transferred to the second ECC correcting unit 62. If the error detecting units 60-1 to 60-8 detect that errors exist in data blocks D respectively, then the data blocks D before being corrected, but not the first error-corrected data DC1-1 to DC1-8, are transferred to the second ECC correcting unit 62. This is because the data blocks D in which the error exist detected by the error detecting units 60-1 to 60-8 are impossible to be corrected, or the data blocks D contain such errors that are beyond the correction capabilities of the first ECC correcting units 61-1 to 61-8, and the error corrections performed by the first ECC correcting units 61-1 to 61-8 result in additional error imparted to the data blocks D. Consequently, the data before being corrected contains less error than the data with the additional error, and thus, the data before being corrected is sent to the second ECC correcting unit 62. The same goes for the RS (1, 1) through RS (8, 4).

Figure 11:
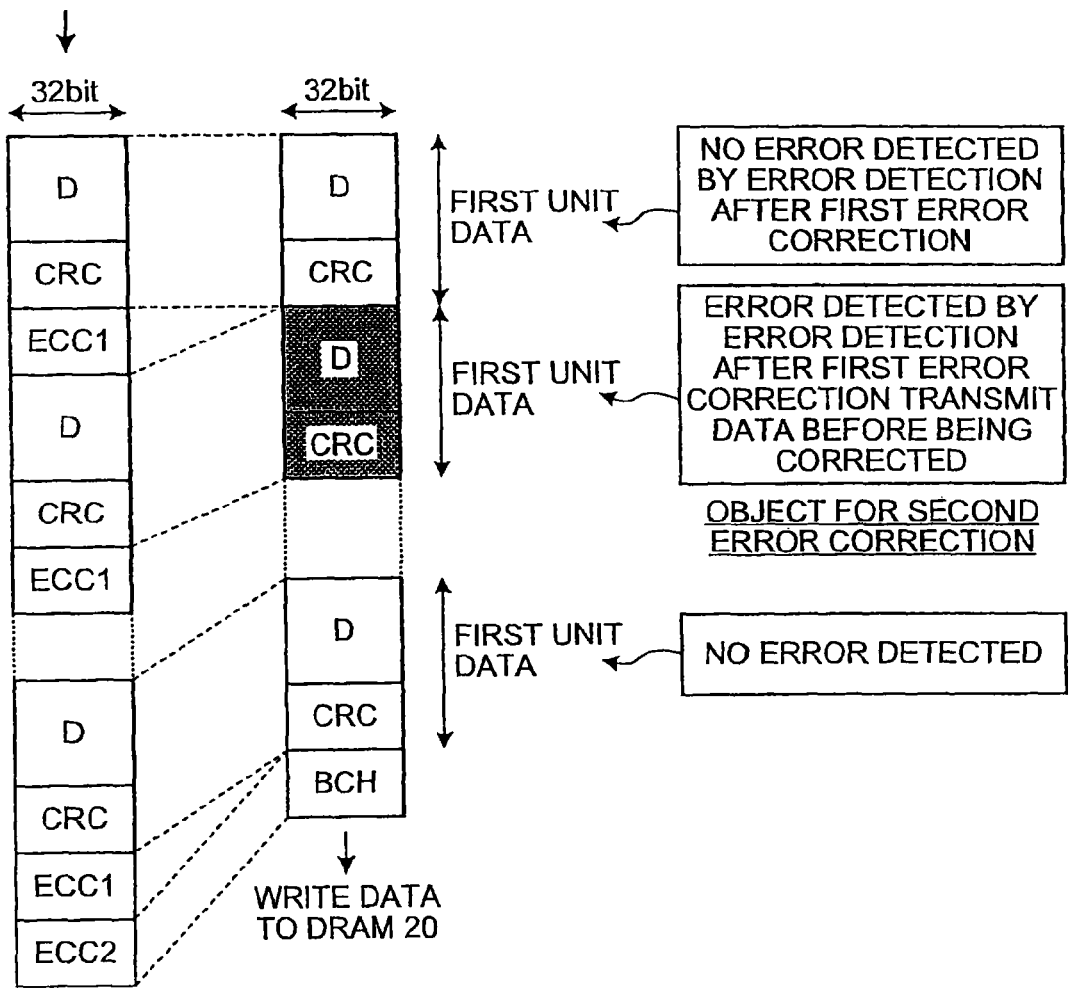
FIG. 11 is a schematic diagram for explaining error detection after first error correction.
Figure 12:
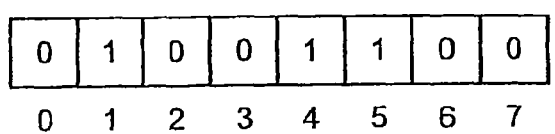
FIG. 12 is a schematic of an example of first error information.

FIG. 11 is a schematic diagram for explaining error detection after the first error correction, and FIG. 12 is a schematic of an example of the first error information S1 to S8. In FIG. 11 and FIG. 12, if there is first unit data with no error as a result of error detection after the first error correction, the first error information for this data is set to S=0, while if there is first unit data with an error as a result of error detection after the first error correction, the first error information for this data is set to S=1. The examples of FIG. 11 and FIG. 12 indicate that errors exist in the first unit data 1, 4, and 5. The first unit data with the errors are an object for second error correction.

Second unit data UDa 1 to UDa 1028 after the first error correction and the first error information S1 to S8 are transferred, page by page, to the second ECC correcting unit 62. The second ECC correcting unit 62 performs second error correction on the first unit data as the object for the second error correction by using the BHC code ECC 2 contained in the second unit data UDa and referring to the first error information S1 to S8. The second error-corrected data DC 2 corrected by the second ECC correcting unit 62 is transferred to the DRAM 20, and data corresponding to the second error-corrected data DC 2, among the data stored in the DRAM 20, is updated.

Subsequently, the error detecting units 60-1 to 60-8 perform error detection operations. More specifically, second error-corrected data blocks D (1, 1) through D (8, 1024) and the corresponding CRC (1, 1) through CRC (8, 1024), and second error-corrected RS (1, 1) through RS (8, 4) and the corresponding CRC (1, 1025) through CRC (8, 1028) are transferred page by page from the DRAM 20 to the error detecting units 60-1 to 60-8, respectively.

The error detecting units 60-1 to 60-8 detect errors in the second error-corrected data blocks D (1, 1) through D (8, 1024) and in the second error-corrected RS (1, 1) through RS (8, 4) using the corresponding CRC (1, 1) through CRC (8, 1028), respectively. The error detecting units 60-1 to 60-8 generate second error information S1 to S8, page by page, indicating in which first unit data and RS code RS an error exists as results of error detection, respectively. The second error information S1 to S8 are transferred to the third ECC correcting units 63-1 to 63-8 respectively. Similarly to the case of the first error correction, if there are data blocks D in which errors exist as results of detection by the error detecting units 60-1 to 60-8, then the data blocks D before being corrected, but not the second error-corrected data DC 2, are transferred to the third ECC correcting units 63-1 to 63-8 respectively. This is because the data blocks D with errors detected by the error detecting units 60-1 to 60-8 are impossible to be corrected, or the data blocks D include such errors that are beyond the correction capability of the second ECC correcting unit 62, and the error correction performed by the second ECC correcting units 62 results in additional error imparted to the data block D. Consequently, the data before being corrected contains less error than the data with the additional error, and thus, the data before being corrected is sent to the third ECC correcting units 63-1 to 63-8. The same goes for the RS (1, 1) through RS (8, 4). In the first embodiment, the error detecting units 60-1 to 60-8 perform error detection operations in parallel. The parallel operation of the error detecting units 60-1 to 60-8 allows reduction in processing time.

Figure 13:
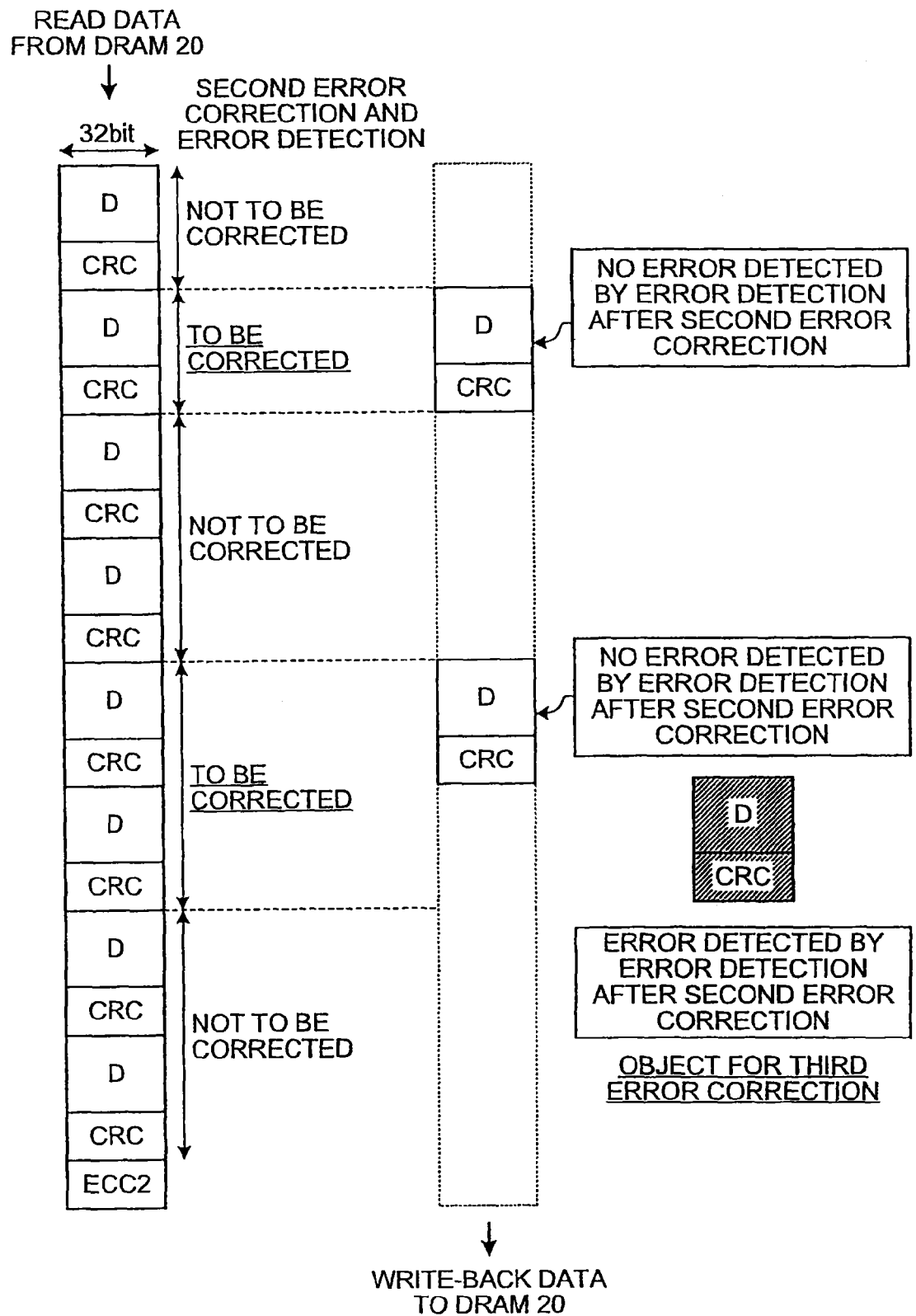
FIG. 13 is a schematic diagram for explaining error detection after second error correction.

FIG. 13 is a schematic diagram for explaining error detection after the second error correction, and FIG. 14 is a schematic of an example of the second error information S1 to S8 after the second error correction. In FIG. 13 and FIG. 14, if there is first unit data with no error as a result of error detection after the second error correction, the second error information for this data is set to S=0, while if there is a block with an error as a result of error detection after the second error correction, the second error information for the block is set to S=1. The examples of FIG. 13 and FIG. 14 indicate that an error exists in the first unit data 5. The first unit data with the error is an object for third error correction.

Figure 15:
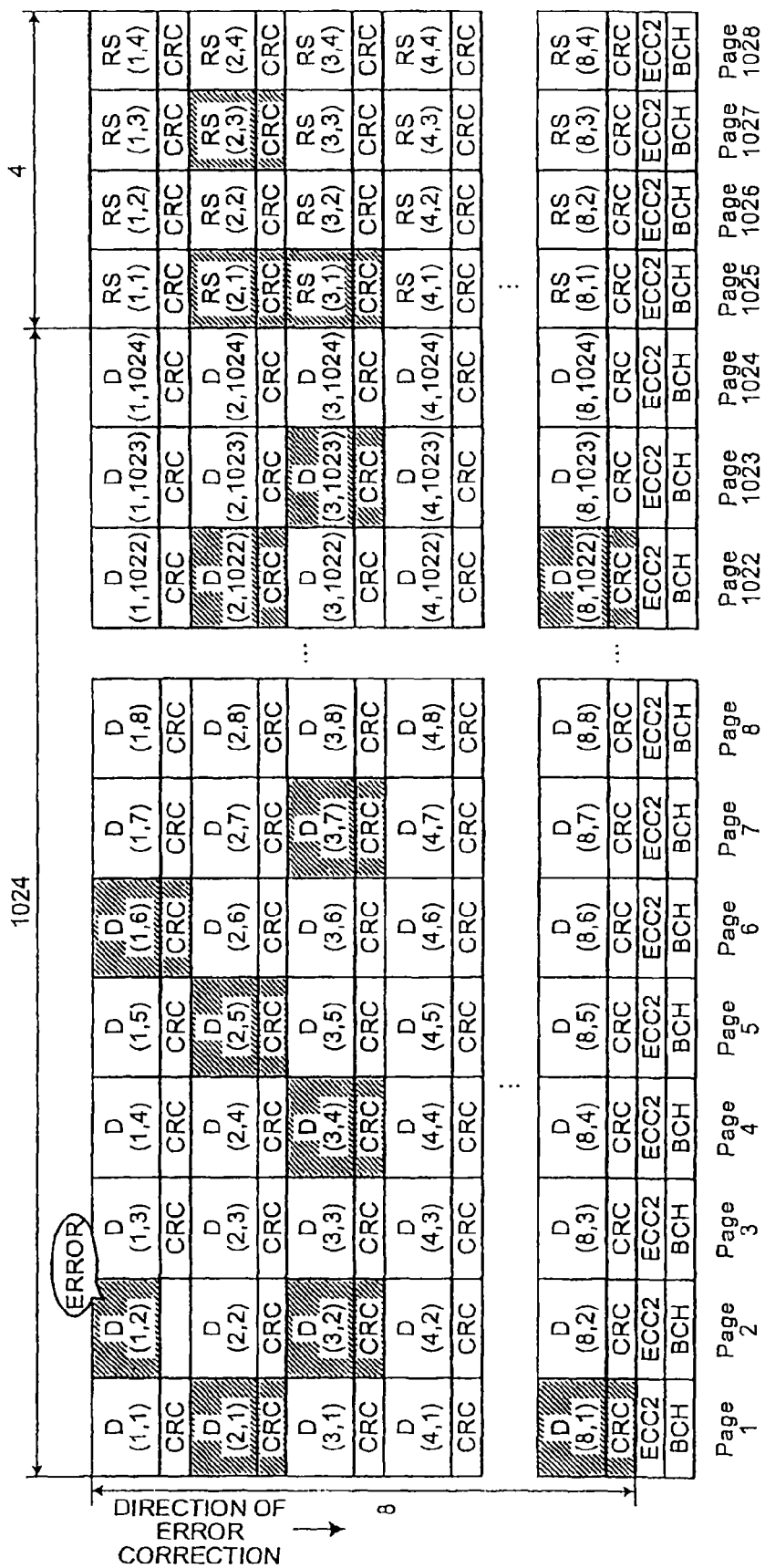
FIG. 15 is a schematic diagram of block data after error correction of a first round performed by a second ECC correcting unit.

FIG. 15 is a schematic diagram of an example of block data after error correction of a first round performed by the second ECC correcting unit 62. Shaded lines indicate data in which errors are detected by the error detecting units 60-1 to 60-8 because the errors cannot be corrected by the error correction of the first round performed by the second ECC correcting unit 62.

If no error exists in all the read data as a result of the error correction of the first round performed by the second ECC correcting unit 62, the error correction operation is finished at this step. Namely, error correction will not be performed by the third ECC correcting unit 63, explained later. For example, the third ECC correcting unit 63 stops the error correction operation by stopping a power supply from the power supply circuit 5 or by stopping a supply of a clock signal from a clock circuit (not shown). Consequently, when there are few errors, the data read time can be reduced. Besides, the error correction operation is not performed by the third ECC correcting unit 63, and this allows reduction in power consumption.

Subsequently, an error correction operation of the first round is performed by the third ECC correcting unit 63. More specifically, the third unit data UDb 1 formed of 1024 data blocks D (1, 1) to D (1, 1024) arranged in the row direction and the four RS (1, 1) to RS (1, 4) generated corresponding thereto are sent from the DRAM 20 to the third ECC correcting unit 63-1. The third ECC correcting unit 63-1 uses the RS (1, 1) to RS (1, 4) to perform error correction in the data blocks D (1, 1) to D (1, 1024). The same goes for the third ECC correcting units 63-2 to 63-8 corresponding to the second to the eighth rows.

In the first embodiment, the third ECC correcting units 63-1 to 63-8 perform error correction operations in parallel, and the parallel operation thereof allows reduction in processing time. The third error-corrected data DC 3 corrected by the third ECC correcting units 63-1 to 63-8 is transferred to the DRAM 20. Data, among the data stored in the DRAM 20, corresponding to the third error-corrected data DC 3 is updated.

Figure 16:
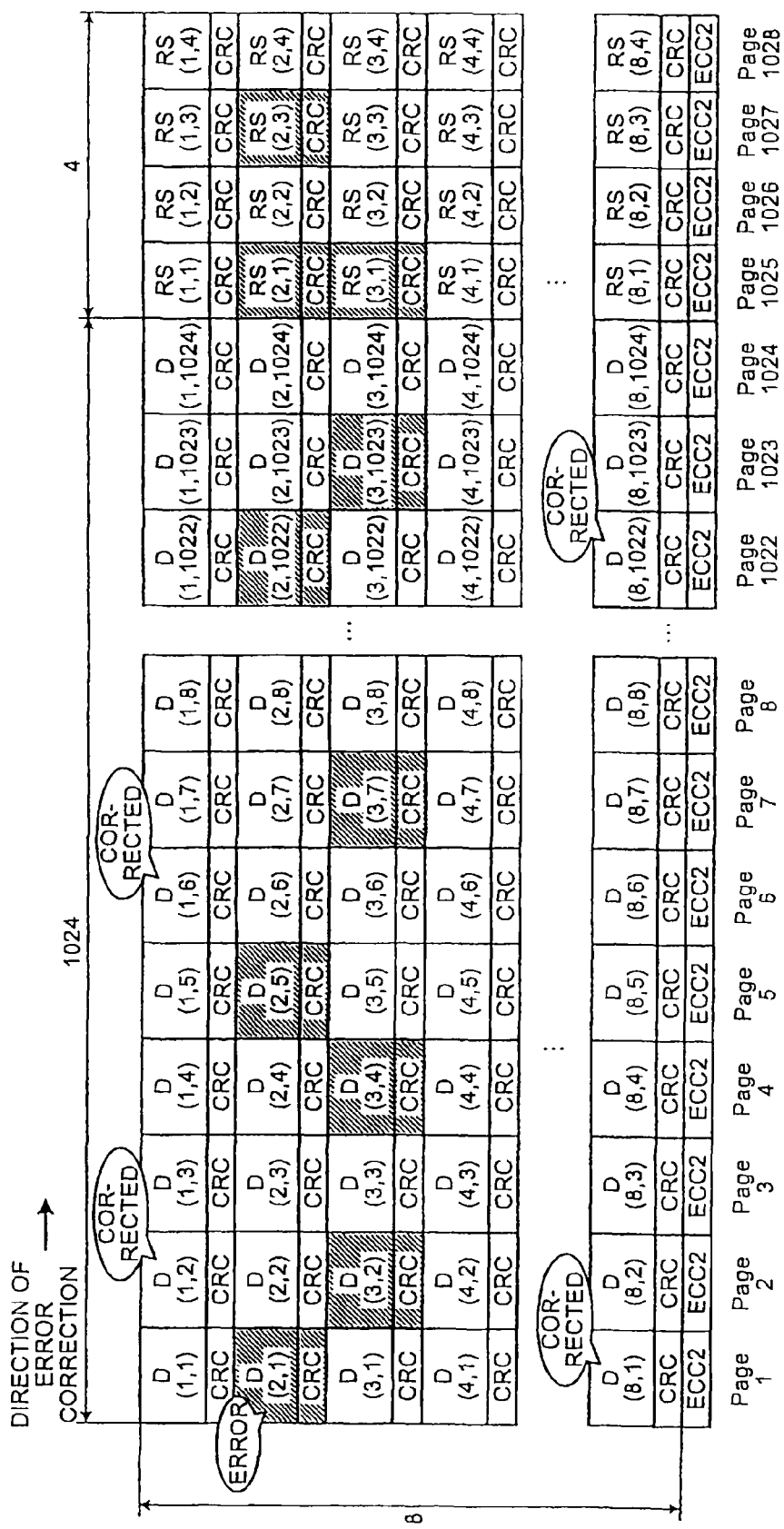
FIG. 16 is a schematic diagram of block data after error correction of a first round performed by a third ECC correcting unit.

FIG. 16 is a schematic diagram of an example of block data after third error correction of a first round is performed by the third ECC correcting unit 63. Errors in the read data D (1, 2) and D (1, 6) are corrected by the third ECC correcting unit 63-1 as shown in FIG. 16, and errors in the read data D (8, 1) and D (8, 1022) are corrected by the third ECC correcting unit 63-8.

As explained above, the error detecting unit 60 is used to identify a location of read data in which an error exists before the error correction is performed by the third ECC correcting unit 63. Consequently, the third ECC correcting unit 63 simply performs error correction only on the read data in which the error is detected. This allows reduction in correction time performed by the third ECC correcting unit 63 and also reduction in power consumption.

Figure 17:
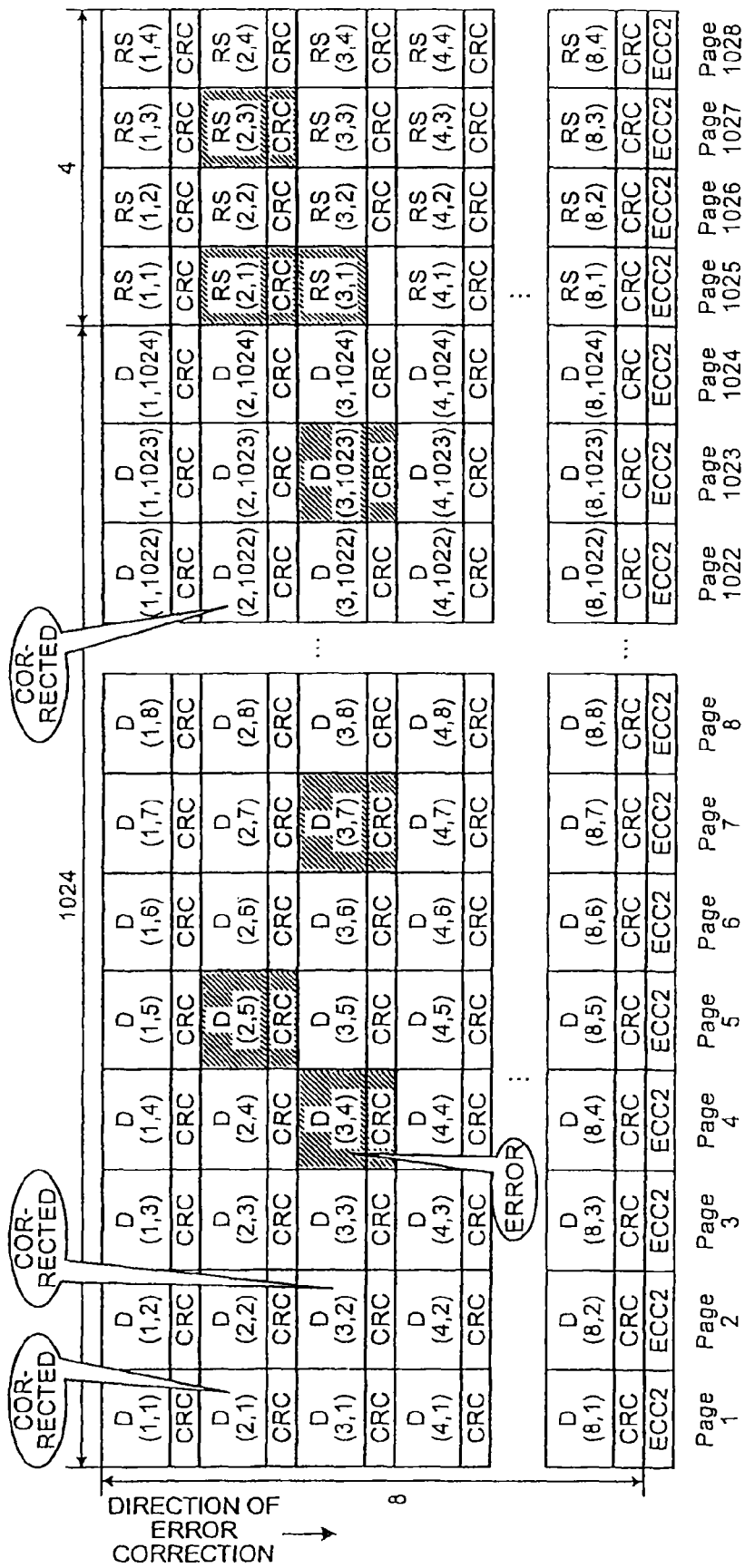
FIG. 17 is a schematic diagram of block data after error correction of a second round performed by the second ECC correcting unit.

Subsequently, the second error correction of the second round is performed on Page 1 to Page 1028 by the second ECC correcting unit 62. The second error correction operation is the same as the error correction of the first round performed by the second ECC correcting unit 62. FIG. 17 is a schematic diagram of an example of block data after the second error correction of the second round is performed by the second ECC correcting unit 62. Errors in the read data D (2, 1), D (3, 2), and D (2, 1022) are corrected by the second ECC correcting unit 62 as shown in FIG. 17.

Thereafter, the error detecting units 60-1 to 60-8 detect errors in all the data blocks D and RS codes. The error detection operation is the same as the error detection operation of the first round performed by the error detecting units 60-1 to 60-8. Third error correction of the second round is performed on the third unit data UDb 1 to UDb 8 by the third ECC correcting units 63-1 to 63-8 respectively. The third error correction operation is the same as the error correction of the first round performed by the third ECC correcting units 63-1 to 63-8.

Figure 18:
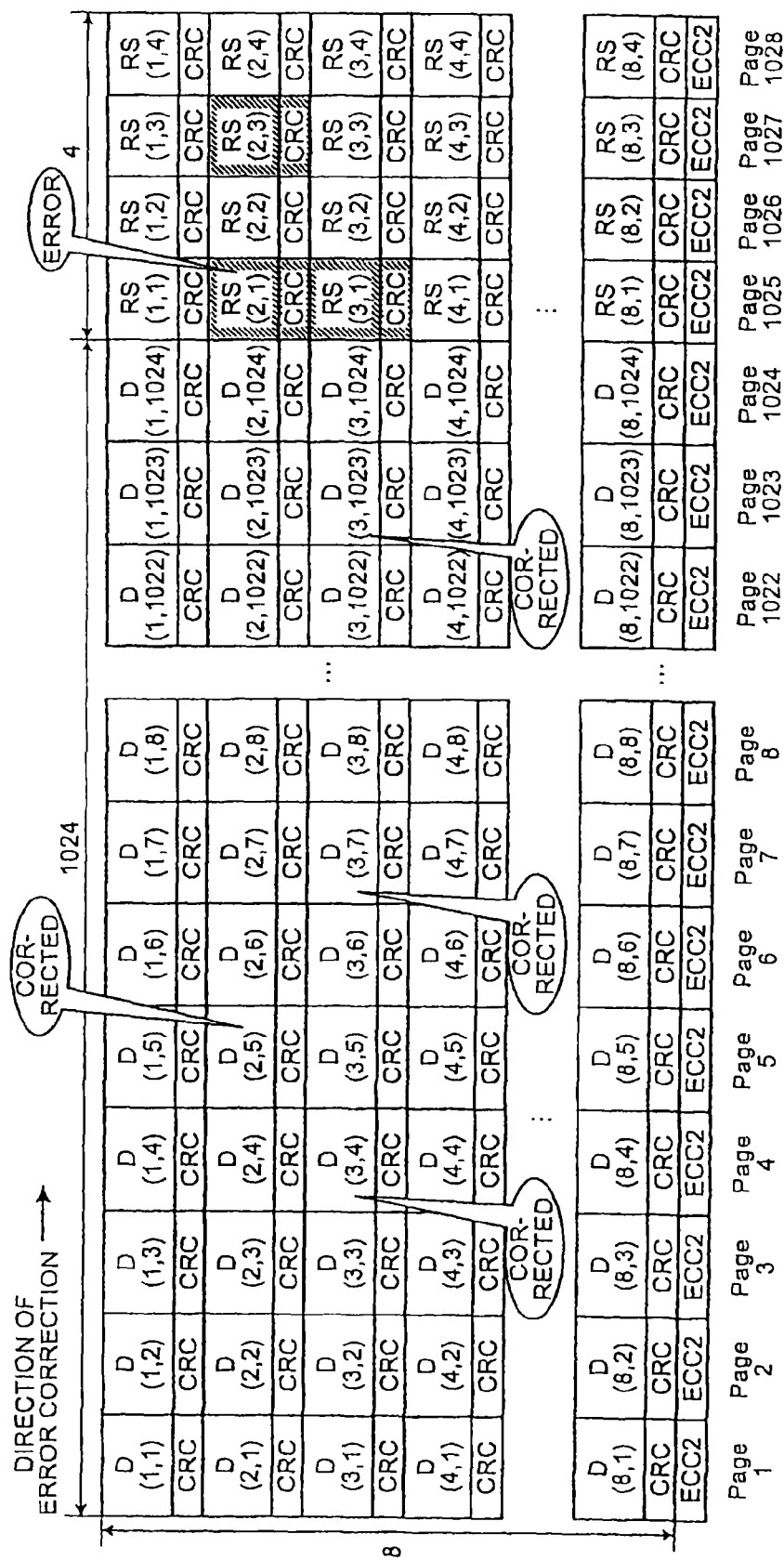
FIG. 18 is a schematic diagram of block data after error correction of a second round performed by the third ECC correcting unit.

FIG. 18 is a schematic diagram of an example of block data after the third error correction of the second round is performed by the third ECC correcting unit 63. An error in the data block D (2, 5) is corrected by the third ECC correcting unit 63-2. Further, errors in the data blocks D (3, 4), D (3, 7), and D (3, 1023) are corrected by the third ECC correcting unit 63-3. With these operations, all the errors in the data blocks D (1, 1) through D (8, 1024) are corrected.

Thereafter, the data blocks D (1, 1) through D (8, 1024) in which all the errors are corrected are output from the DRAM 20 to the host device 1.

Figure 19:
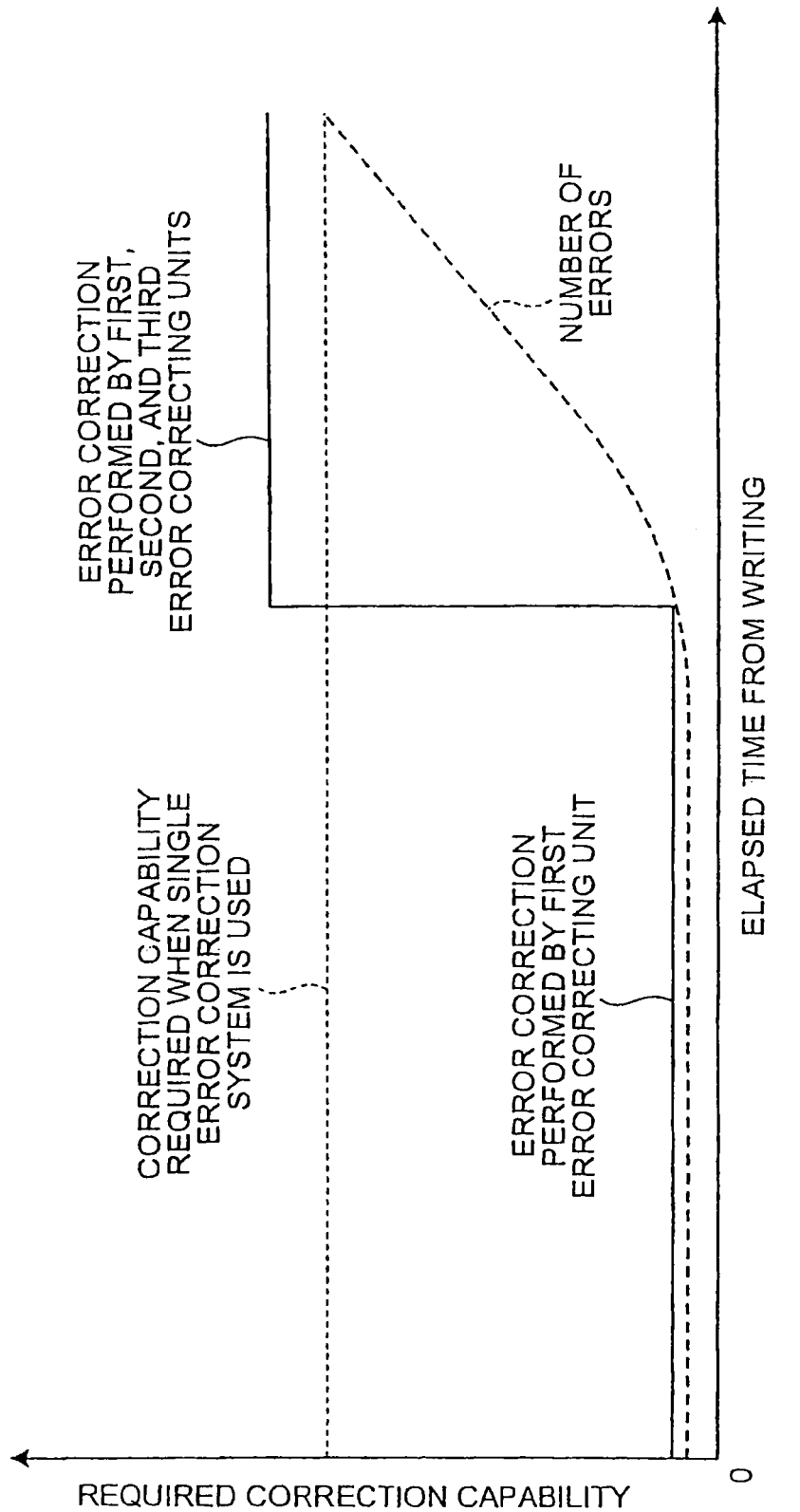
FIG. 19 is a schematic of a relationship between an elapsed time from writing and required correction capability.

FIG. 19 is a schematic of a relationship between an elapsed time from writing data to the NAND memory 10 and required correction capability. As shown in FIG. 19, if the elapsed time becomes longer, then the number of errors in the data written to the NAND memory 10 increases. The error correction capability is, therefore, changed in association with an increase in the number of errors. Besides, each error correction capability of the first ECC correcting unit 61 to the third ECC correcting unit 63 is decided so that an excessive level or an insufficient level of the error correction capability is not used. More specifically, the error correction capabilities of the first ECC correcting unit 61 to the third ECC correcting unit 63 are decided so that the error correction can be performed only by the first ECC correcting unit 61 when the elapsed time is short and the error correction can be performed by the first ECC correcting unit 61, the second ECC correcting unit 62, and by the third ECC correcting unit 63 after the elapsed time has passed a predetermined time (a time when the number of errors sharply increases).

As explained above, according to the first embodiment, it is possible to first perform the first error correction on the read data using the first error correction code (Hamming code), then perform the second error correction on the result of the first error correction using the second error correction code (BHC code), and further perform the third error correction on the result of the second error correction using the third error correction code (RS code). Therefore, even if the correction capabilities of the first error correction code to the third error correction code are decreased, desired correction capability can be ensured and the circuit scale can also be reduced.

The error correction is triply performed using the first error correction code (Hamming code) with low-level error correction capability, the second error correction code (BHC code) with medium-level error correction capability, and the third error correction code (RS code) with high-level error correction capability, and this can extremely reduce the frequency of decoding of high-level error correction. As a result, even if hardware is not provided, the error correction can be satisfactorily performed using software, which allows reduction in the circuit scale.

When it is determined that no error exists in all the read data, as a result of the first error correction performed by the first ECC correcting unit 61, the second ECC correcting unit 62 and the third ECC correcting unit 63 do not perform error correction. Thus, when there are few errors, the data read time can be reduced. More specifically, the reduction in data read time when there are few errors is compatible with the performance with high correction capability when there are many errors. Furthermore, by stopping the operations of the second ECC correcting unit 62 and the third ECC correcting unit 63, power consumption can be reduced.

In addition, the second error correction code (BCH code) is used to perform error correction on data in the column direction, while the third error correction code (RS code) is used to perform error correction on data in the row direction. These corrections allow error correction over all the pages in a memory block of the NAND memory 10. Moreover, the first embodiment is particularly useful for a semiconductor memory in which error probabilities largely differ caused by locations of data to be stored because error correction can be performed many times on an area with high error probability.

The error detecting unit 60 is used to enable identification of a location of data in which an error exists, and thus, the second ECC correcting unit 62 and the third ECC correcting unit 63 have only to perform error correction on read data in which an error is detected. This enables the processing time by the second ECC correcting unit 62 and the third ECC correcting unit 63 to be reduced.

Further, because the location of data in which an error exists can be detected using the error detection code (CRC), the third ECC correcting unit 63 does not need to perform error detection. This enables all the RS codes (four RS codes in the first embodiment) to be used for error correction.

An SSD according to a second embodiment of the present invention will be explained below with reference to FIG. 20 through FIG. 22. The second embodiment is configured so that the SSD 100 performs the first and the second error corrections while a host device 201, but not the SSD 100, performs the third error correction with high-level error correction capability. This configuration allows reduction in load on the SSD 100 because almost all errors can be corrected by the first and the second error corrections while the third error correction is used far less frequently than the others yet requires a long processing time.

Figure 20:
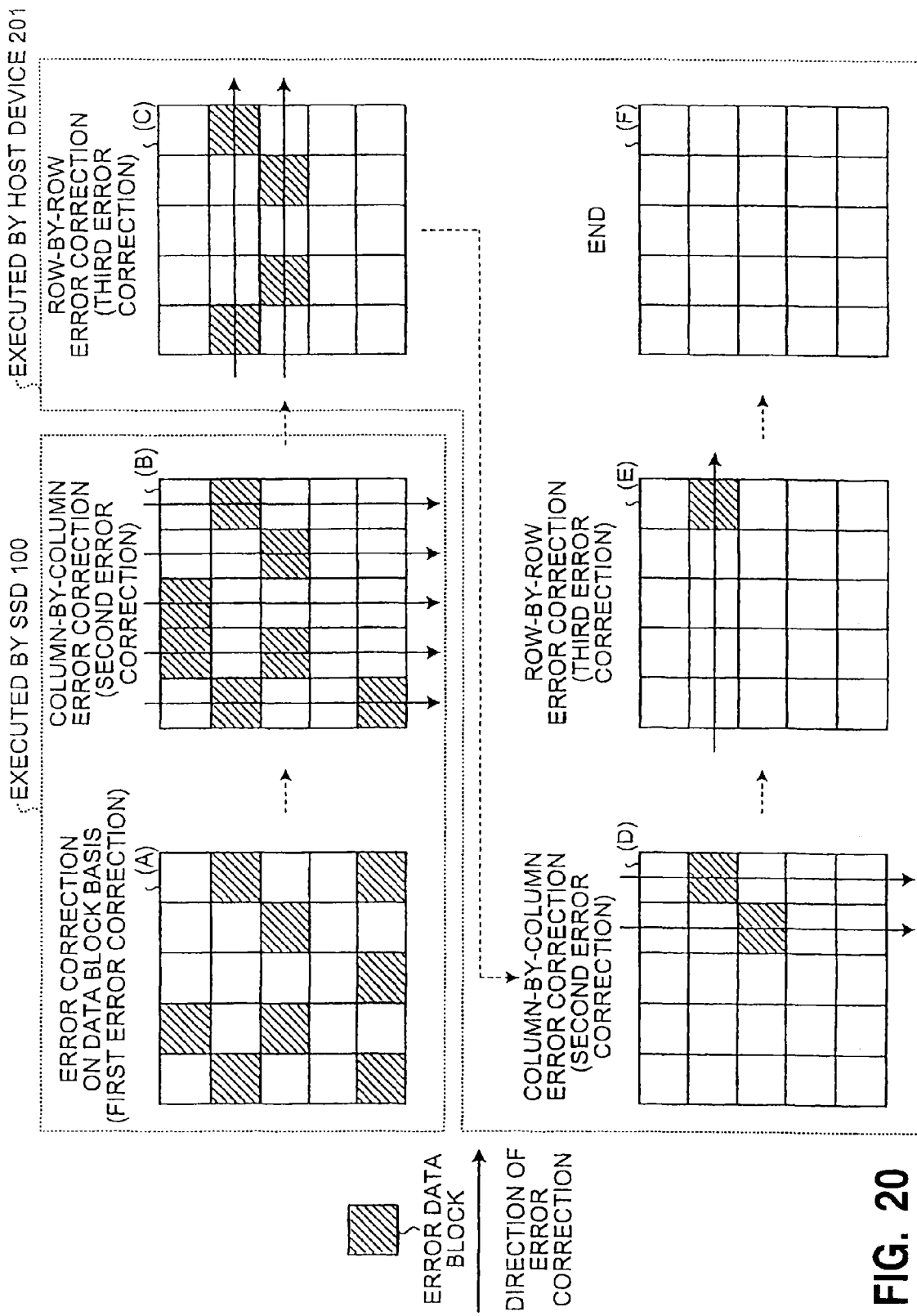
FIG. 20 is a schematic diagram for explaining the principle of error correction according to a second embodiment of the present invention.

FIG. 20 is a schematic diagram for explaining the principle of error correction according to the second embodiment. FIG. 21 is a schematic diagram of a configuration of the SSD 100 and the host device 201 according to the second embodiment. Referring to FIG. 20, the first error correction (A) and the second error correction (B) are preformed by the SSD 100 while the processes of the third error correction (C) and thereafter are performed by the host device 201.

Figure 21:
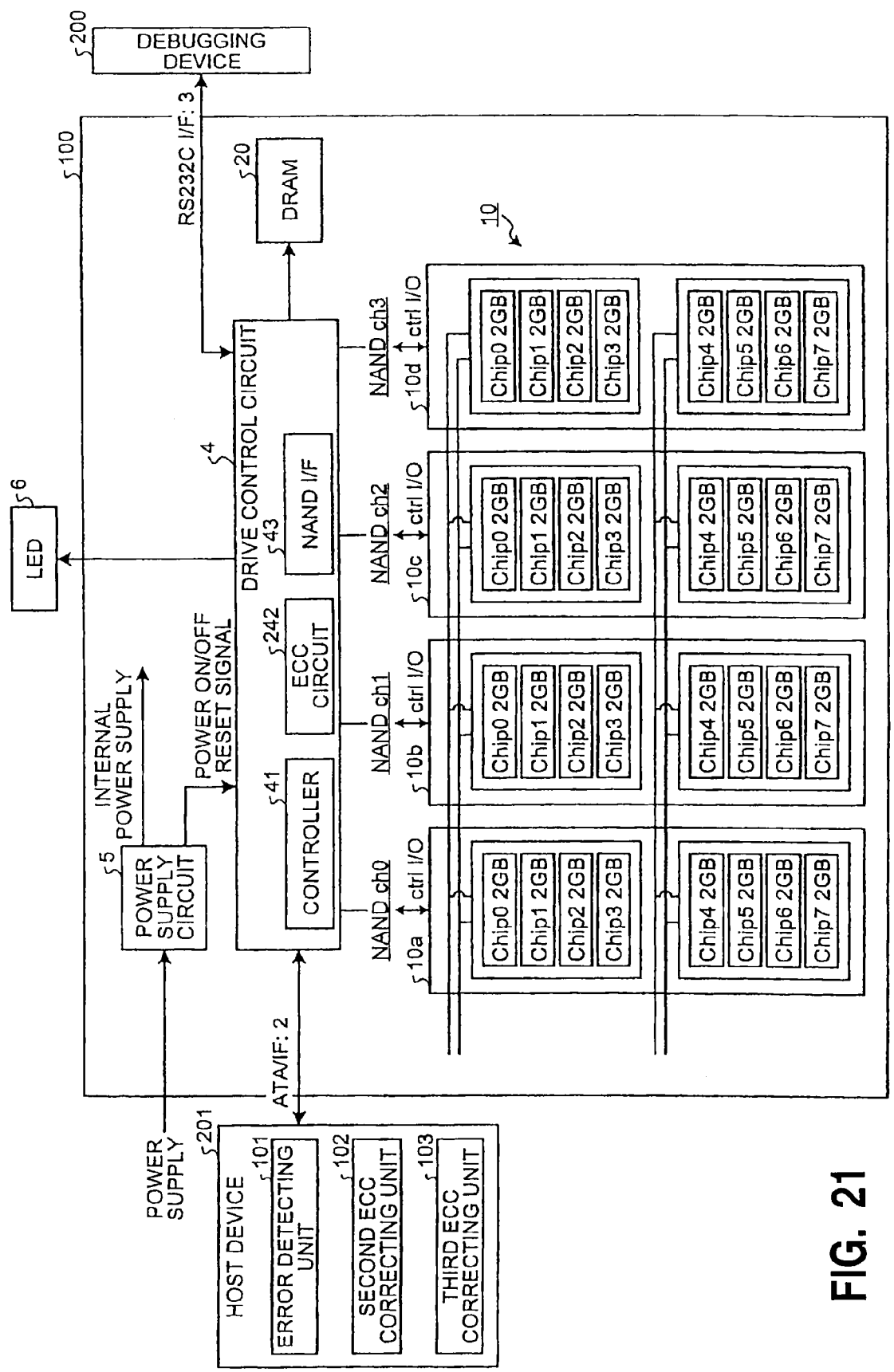
FIG. 21 is a schematic diagram of a configuration of an SSD and a host device according to the second embodiment.

As shown in FIG. 21, the host device 201 includes an error detecting unit 101 that detects an error in each data block D using CRC, a second ECC correcting unit 102 that performs the second error correction using the BCH code (second error correction code), and a third ECC correcting unit 103 that performs the third error correction using the RS code (third error correction code). A CPU of the host device 201 executes software to allow implementation of the error detecting unit 101, the second ECC correcting unit 102, and the third ECC correcting unit 103.

The SSD 100 transmits the second error-corrected data blocks D (1, 1) through D (8, 1024) and the corresponding CRC (1, 1) through CRC (8, 1024), the RS (1, 1) through RS (8, 4) and the corresponding CRC (1, 1025) through CRC (8, 1028), the ECC 1 (1, 1) through ECC 1 (8, 1028), and the second error information to the host device 201.

The host device 201 performs the third error correction on the second error-corrected data received from the SSD 100 using the second error information, and checks the result of correction using CRC. If an error is detected, the second error correction is again performed, and the second and the third error corrections are alternately repeated until the error is eliminated (processes in FIG. 15 through FIG. 19 are performed).

Figure 22:
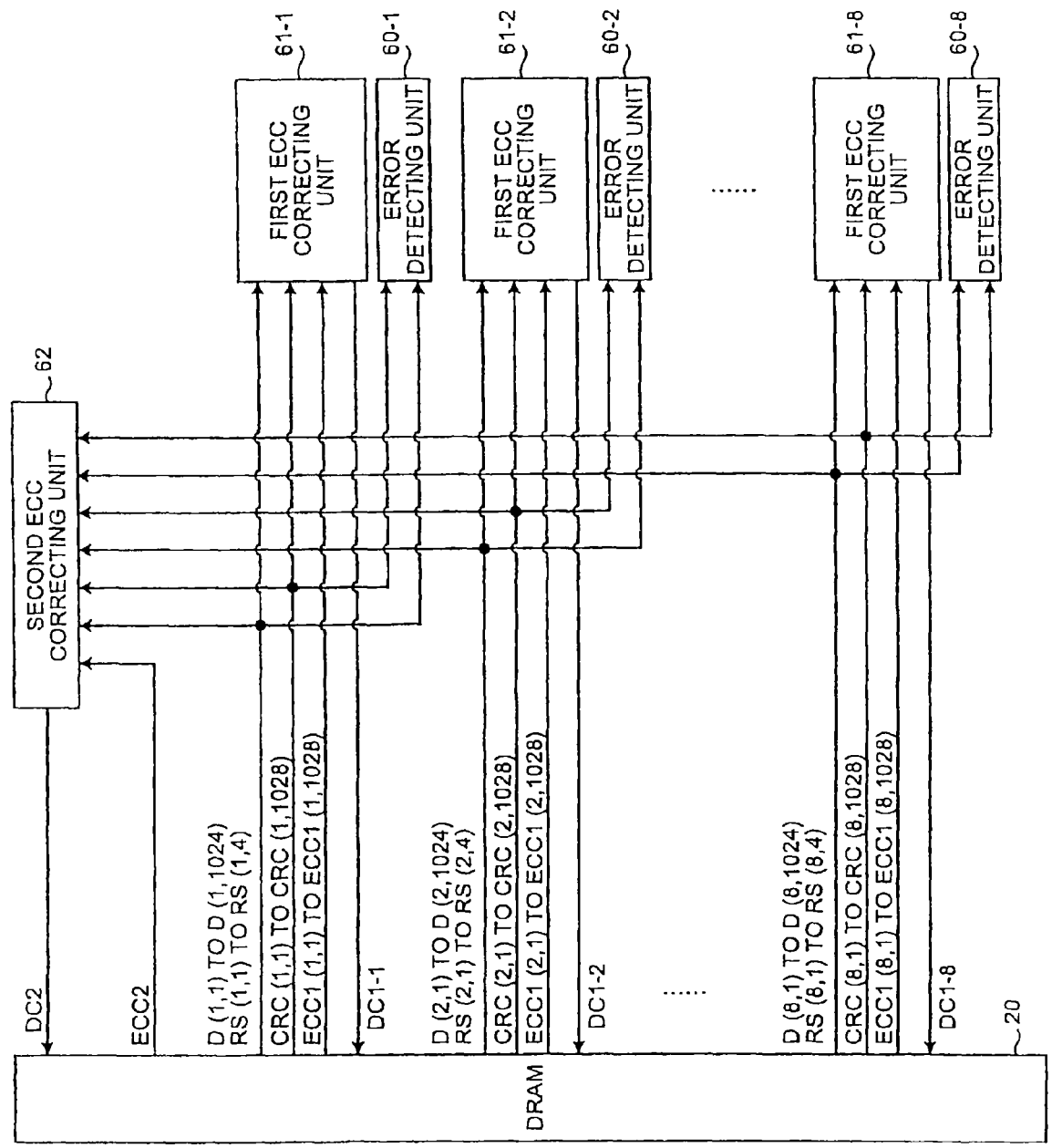
FIG. 22 is a block diagram of a main portion of a decoding system in an ECC circuit according to the second embodiment.

FIG. 22 is a block diagram of a main portion of a decoding system in an ECC circuit 242 according to the second embodiment. The decoding system of the ECC circuit 242 does not need to incorporate the third ECC correcting unit, and thus, the circuit scale can be reduced.

According to the second embodiment, because the third error correction is performed by the host device 201, there is no need to perform the third error correction by the SSD 100, which allows reduction in the load on the SSD 100 and in the circuit scale.

In the second embodiment, the present invention is applied to the SSD having the NAND memory, however, the present invention may be applied to any SSD having other flash electrically erasable programmable read-only memory (EEPROM) such as an NOR type memory.

INDUSTRIAL APPLICABILITY

According to the present invention, it is possible to provide the semiconductor storage device, the method for controlling the same, and the error correction system capable of reducing the power consumption and the circuit scale without detriment to the error correction capability.

The invention claimed is:
1. A semiconductor storage device comprising:
  a first error-correction-code generating unit that generates a first error correction code for each first unit data included in first data and for first unit data included in second data;
  a second error-correction-code generating unit that generates a second error correction code for a set of data which includes at least one first unit data from first data and one first unit data from second data; and a memory that can store therein at least the first data and second data.

2. The semiconductor storage device according to claim 1, wherein levels of error correction capabilities are provided in a descending order where the second error correction code is greater than the first error correction code.

3. The semiconductor storage device according to claim 1, further comprising an error-detection-code generating unit that generates an error detection code for first unit data included in first data and for first unit data included in second data.

4. The semiconductor storage device according to claim 1, wherein the memory comprises a first group of memory cells and a first word line, and the first group of memory cells being commonly connected to the first word line, wherein first data and first error correction code each generated for first data are stored in the first group of memory cells.

5. The semiconductor storage device according to claim 1, further comprising:
   a first error correcting unit that performs a first error correction process, using the first error correction code, on the first unit data included in first data for which the first error correction code is generated; and
   a second error correcting unit that performs a second error correction process, using the second error correction code, on the set of data for which the second error correction code is generated.

6. The semiconductor storage device according to claim 5, wherein the first error correcting unit and the second error correcting unit alternately repeat respective error correction processes.

7. The semiconductor storage device according to claim 1, wherein the first error correction code is a BCH code and the second error correction code is an RS code.

* * * * *